(12) United States Patent
Kawashima et al.

(10) Patent No.: US 8,860,037 B2
(45) Date of Patent: Oct. 14, 2014

(54) THIN-FILM TRANSISTOR DEVICE

(71) Applicant: Panasonic Corporation, Osaka (JP)

(72) Inventors: Takahiro Kawashima, Osaka (JP); Tomohiko Oda, Osaka (JP); Hikaru Nishitani, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/243,294

(22) Filed: Apr. 2, 2014

(65) Prior Publication Data

US 2014/0209911 A1 Jul. 31, 2014

Related U.S. Application Data

(63) Continuation of application No. PCT/JP2012/006462, filed on Oct. 9, 2012.

(30) Foreign Application Priority Data

Oct. 12, 2011 (JP) ................... 2011-225307
Oct. 12, 2011 (JP) ................... 2011-225308

(51) Int. Cl.
*H01L 29/04* (2006.01)
*H01L 27/14* (2006.01)
*H01L 29/786* (2006.01)
*H01L 27/12* (2006.01)

(52) U.S. Cl.
CPC ...... *H01L 27/1222* (2013.01); *H01L 29/78651* (2013.01); *H01L 27/1274* (2013.01)
USPC ............... 257/72; 257/66; 257/75; 257/205; 438/680; 438/150

(58) Field of Classification Search
CPC .............. H01L 29/78651; H01L 27/1274; H01L 27/1222; H01L 29/4908; H01L 29/78675
USPC ............... 438/150, 680; 257/66, 72, 75, 205
See application file for complete search history.

(56) References Cited

U.S. PATENT DOCUMENTS 5,795,795 A 8/1998 Kousai
6,143,661 A 11/2000 Kousai
(Continued)

FOREIGN PATENT DOCUMENTS

EP 0473988 3/1992
JP 61-153277 7/1986
(Continued)

OTHER PUBLICATIONS

PCT English Translation of International Preliminary Report on Patentability: PCT/JP2012/006462; May 12, 2014.*
(Continued)

*Primary Examiner* — Nicholas Tobergte
(74) *Attorney, Agent, or Firm* — Greenblum & Bernstein, P.L.C.

(57) ABSTRACT

A thin-film transistor device includes a gate electrode formed above a substrate, a gate insulating film formed on the gate electrode, a crystalline silicon thin film that is formed above the gate insulating film and has a channel region, an amorphous silicon thin film formed on the crystalline silicon thin film, and a source electrode and a drain electrode that are formed above the channel region, and the crystalline silicon thin film has a half-width of a Raman band corresponding to a phonon mode specific to the crystalline silicon thin film of 5.0 or more and less than 6.0 $cm^{-1}$, and an average crystal grain size of about 50 nm or more and 300 nm or less.

8 Claims, 31 Drawing Sheets

(56) References Cited

U.S. PATENT DOCUMENTS

| | | |
|---|---|---|
| 6,258,173 B1 | 7/2001 | Kirimura |
| 6,559,036 B1 | 5/2003 | Ohtani |
| 6,723,421 B2 * | 4/2004 | Ovshinsky et al. ........ 428/315.7 |
| 7,186,600 B2 | 3/2007 | Ohtani |
| 7,465,614 B2 | 12/2008 | Kakkad |
| 7,847,294 B2 | 12/2010 | Ohtani |
| 2001/0032589 A1 | 10/2001 | Kirimura |
| 2002/0013114 A1 | 1/2002 | Ohtani |
| 2006/0017052 A1 | 1/2006 | Kakkad |
| 2007/0024787 A1 | 2/2007 | Arai |
| 2007/0117293 A1 | 5/2007 | Ohtani |
| 2011/0186845 A1 | 8/2011 | Yamayoshi |
| 2013/0030728 A1 * | 1/2013 | Kawashima et al. ........... 702/56 |

FOREIGN PATENT DOCUMENTS

| | | |
|---|---|---|
| JP | 64-059807 | 3/1989 |
| JP | 04-296015 | 10/1992 |
| JP | 06-342909 | 12/1994 |
| JP | 08-046205 | 2/1996 |
| JP | 09-139357 | 5/1997 |
| JP | 11-214305 | 8/1999 |
| JP | 11-214307 | 8/1999 |
| JP | 2000-058452 | 2/2000 |
| JP | 2000-114172 | 4/2000 |
| JP | 2000-114526 | 4/2000 |
| JP | 2002-231631 | 8/2002 |
| JP | 3535241 | 3/2004 |
| JP | 2005-229127 | 8/2005 |
| JP | 2006-041472 | 2/2006 |
| JP | 2007-035963 | 2/2007 |
| JP | 2008-016717 | 1/2008 |
| JP | 2011-159907 | 8/2011 |

OTHER PUBLICATIONS

International Search Report in PCT/JP2012/006462, mailed on Jan. 15, 2013.

* cited by examiner

THIN-FILM TRANSISTOR DEVICE

CROSS REFERENCE TO RELATED APPLICATIONS

This is a continuation application of PCT International Application No. PCT/JP 2012/006462 filed on Oct. 9, 2012, designating the United States of America, which is based on and claims priority of Japanese Patent Applications Nos. 2011-225308 and 2011-225307 filed on Oct. 12, 2011. The entire disclosures of the above-identified applications, including the specifications, drawings and claims are incorporated herein by reference in their entirety.

FIELD

One or more exemplary embodiments disclosed herein relate generally to a thin-film transistor device.

BACKGROUND

Electronic appliances are available such as, for example, television receivers equipped with an organic electro-luminescent (hereinafter, referred to as "organic EL") display apparatus or a liquid crystal display apparatus. In such electronic appliances, light-emitting elements arranged in a matrix to constitute an organic display apparatus or a liquid crystal display apparatus are driven by a plurality of thin-film transistor (TFT) devices.

A TFT is formed by, for example, forming a source electrode and a drain electrode, a semiconductor layer (channel layer), a gate insulating film, and a gate electrode in sequence on a substrate, and a thin film made of silicon semiconductor is commonly used as a channel layer of the TFT (see, for example, Patent Literature (PTL) 1).

Silicon semiconductor thin films are roughly classified into non-crystalline silicon (amorphous silicon, a-Si) thin films; and silicon thin films (crystalline silicon thin films) having crystallinity. The crystalline silicon thin films can be further classified into polycrystalline silicon thin films, microcrystalline silicon thin films, monocrystalline silicon thin films, and the like.

Among them, currently, the non-crystalline silicon thin films are most commonly used as channel layers for use in elements for large-screen liquid crystal displays because they can be formed uniformly on large-area substrates at a relatively low temperature by chemical vapor deposition method (CVD method) or the like. The non-crystalline silicon thin films, however, are inferior to the crystalline silicon thin films in terms of characteristics such as carrier mobility. For this reason, it is eagerly desired to achieve a TFT that includes a crystalline silicon thin film as a channel layer, so as to achieve a display that quickly starts working and has a high definition.

Under the circumstances, techniques for forming a crystalline silicon thin film have been proposed (for example, PTLs 2 to 4).

CITATION LIST

Patent Literature

[PTL 1] Japanese Unexamined Patent Application Publication No. H6-342909
[PTL 2] Japanese Unexamined Patent Application Publication No. S61-153277
[PTL 3] Japanese Patent No. 3535241
[PTL 4] Japanese Unexamined Patent Application Publication No. 2008-016717

SUMMARY

Technical Problem

However, the crystalline silicon thin films produced by the conventional methods listed above have completely different film qualities. Also, even high-mobility crystalline silicon thin films produced by the same method may have different film qualities, and thus may not have a target mobility (have variability in mobility).

The present disclosure has been made in view of the above-described background, and one non-limiting and exemplary embodiment provides a thin-film transistor device in which a high-mobility crystalline silicon thin film whose mobility varies little is used as a channel layer.

Solution to Problem

In order to achieve the above object, a thin-film transistor device according to one aspect of the present disclosure is a thin-film transistor device including: a gate electrode formed above a substrate; a gate insulating film formed on the gate electrode; a crystalline silicon thin film that is formed above the gate insulating film and has a channel region, a semiconductor film formed on the crystalline silicon thin film; and a source electrode and a drain electrode that are formed above the channel region, wherein the crystalline silicon thin film has a half-width of a Raman band corresponding to a phonon mode specific to the crystalline silicon thin film of 5.0 cm$^{-1}$ or more and less than 6.0 cm$^{-1}$, and the crystalline silicon thin film has an average crystal grain size of about 50 nm or more and 300 nm or less.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

One or more exemplary embodiments or features disclosed herein provide a thin-film transistor device in which a high-mobility crystalline silicon thin film whose mobility varies little is used as a channel layer.

BRIEF DESCRIPTION OF DRAWINGS

These and other advantages and features will become apparent from the following description thereof taken in conjunction with the accompanying Drawings, by way of non-limiting examples of embodiments disclosed herein.

Figure 1:
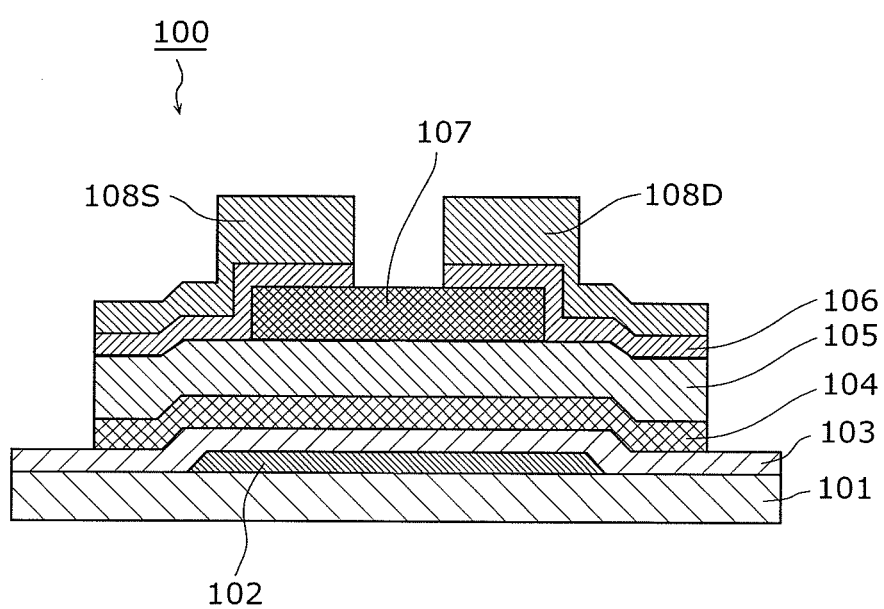
FIG. 1 is a cross-sectional view schematically showing a configuration of a thin-film transistor device according to Embodiment 1.

DESCRIPTION OF EMBODIMENTS (Underlying Knowledge Forming Basis of the Present Disclosure)

In relation to the techniques of PTLs 2 to 4 disclosed in the Background section, the inventors have found the following problems.

For example, as one of methods for forming a crystalline silicon thin film, there is a method in which a metal catalyst is added to an amorphous silicon film formed on a substrate, which is then heated to polycrystallize the amorphous silicon film. This method is advantageous in that the amorphous silicon film can be crystallized at a low temperature, but is problematic in that the increase in the number of processing steps increases the cost, and it is difficult to completely remove the metal elements after crystallization.

Also, PTL 2, for example, discloses a method in which a crystalline silicon thin film is formed directly on a substrate by chemical vapor deposition (CVD), as one of methods for forming a crystalline silicon thin film. With this method, it is possible to achieve a cost reduction by the reduction in the number of steps, but the resulting crystal structure is microcrystalline, which poses a problem in that it is difficult to satisfy the mobility (on-resistance characteristics) required for drive transistors.

Also, PTL 3, for example, discloses a method in which an amorphous silicon film is formed on a substrate by CVD method or the like, and then, the amorphous silicon film is irradiated with laser at a predetermined energy density of an excimer laser so as to polycrystallize the amorphous silicon film, as one of methods for forming a crystalline silicon thin film. This method imposes little burden on the glass substrate due to the laser irradiation time being very short, and also enables formation of a crystalline silicon thin film having a melt silicon crystal structure having a large crystal structure and a high mobility.

Furthermore, PTL 4, for example, discloses a method for forming a crystalline silicon thin film by irradiating an amorphous silicon film with green laser light having a wavelength of 532 nm obtained through wavelength conversion from infrared laser light having a wavelength of 1064 nm by using another solid conversion crystal element, so as to polycrystallize the amorphous silicon film, as one of methods for forming a crystalline silicon thin film.

However, the crystalline silicon thin films produced by the conventional methods described above have completely different film qualities. Also, even crystalline silicon thin films produced by the same method may have different film qualities depending on the crystallization condition.

It is commonly known that, in semiconductor devices that include a crystalline semiconductor film as an active layer, the film quality (for example, crystallinity, defect density, and the like) of the active layer greatly affects the device characteristics. In other words, in transistor elements in which a crystalline silicon thin film is used as a channel layer, the film quality of the crystalline silicon thin film greatly affects the element characteristics such as, for example, carrier mobility, threshold voltage, and reliability. Accordingly, even if high-mobility crystalline silicon thin films are formed by the same method in order to be used as an active layer in transistor elements, they may have different film qualities, and thus not have a target mobility (have variability in mobility).

To address this, one aspect of the present disclosure has been made under the above-described background, and it is an object of the present disclosure to provide a thin-film transistor device in which a high-mobility crystalline silicon thin film whose mobility varies little is used as a channel layer.

In order to achieve the above object, a thin-film transistor device according to one aspect of the present disclosure is a thin-film transistor device including: a gate electrode formed above a substrate; a gate insulating film formed on the gate electrode; a crystalline silicon thin film that is formed above the gate insulating film and has a channel region, a semiconductor film formed on the crystalline silicon thin film; and a source electrode and a drain electrode that are formed above the channel region, wherein the crystalline silicon thin film has a half-width of a Raman band corresponding to a phonon mode specific to the crystalline silicon thin film of 5.0 cm$^{-1}$ or more and less than 6.0 cm$^{-1}$, and the crystalline silicon thin film has an average crystal grain size of about 50 nm or more and 300 nm or less.

With this configuration, it is possible to achieve a thin-film transistor device in which a high-mobility crystalline silicon thin film whose mobility varies little is used as a channel layer.

Here, for example, the crystalline silicon thin film contains crystals that are predominantly oriented in (100) direction among (111) and (100) directions.

Also, for example, a ratio of the half-width of the Raman band of the crystalline silicon thin film with respect to a half-width of a Raman band of monocrystalline silicon may be 1.5 or more and 1.8 or less.

Also, for example, a difference between the half-width of the Raman band of the crystalline silicon thin film and a half-width of a Raman band of monocrystalline silicon may be 1.8 cm$^{-1}$ or more and 2.4 cm$^{-1}$ or less.

Also, for example, a ratio of a peak value of the Raman band of the crystalline silicon thin film with respect to a half-width of a Raman band of crystalline silicon may be 0.1 or more and 0.2 or less.

Also, for example, a peak position in the Raman band of the crystalline silicon thin film may be 516 cm$^{-1}$ or more and 518 cm$^{-1}$ or less.

Also, for example, the crystalline silicon thin film may have a field-effect mobility of 20 cm$^2$/V·s or more and 50 cm$^2$/V·s or less.

Furthermore, for example, the thin-film transistor device may further include a channel protection layer formed on the semiconductor film formed above the channel region.

Furthermore, for example, the thin-film transistor device may further include a channel protection layer for protecting the channel region, the channel protection layer being formed between the semiconductor film and the crystalline silicon thin film.

Hereinafter, certain exemplary embodiments are described in greater detail with reference to the accompanying Drawings.

Each of the embodiments described below shows a specific example of preferred examples of the present disclosure. The numerical values, shapes, materials, structural elements, the arrangement and connection of the structural elements, steps, the processing order of the steps and the like shown in the following embodiments are merely examples, and therefore they are not intended to limit the scope of the present disclosure. Among the structural elements described in the following embodiments, structural elements not recited in any one of the independent claims that indicate the broadest concepts of the invention are described as arbitrary structural elements.

Embodiment 1

Hereinafter, a thin-film transistor device according to one aspect of the present disclosure and a method for manufacturing the same will be described. Among the structural elements described in the following embodiments, those not recited in the claims are not necessarily required to achieve the object of the present disclosure, but are described as arbitrary structural elements that constitute a more preferred embodiment. Note that the diagrams are schematic diagrams, and thus they are not shown to scale.

A configuration of a thin-film transistor device 100 according to the present embodiment will be described first with reference to FIG. 1. FIG. 1 is a cross-sectional view schematically showing a configuration of a thin-film transistor device according to the present embodiment.

The thin-film transistor device 100 shown in FIG. 1 is a channel protected, bottom-gate thin film transistor, and includes a substrate 101, a gate electrode 102 formed on the substrate 101, a gate insulating film 103 formed on the gate electrode 102, a crystalline silicon thin film 104 formed on the gate insulating film 103, an amorphous silicon thin film 105 formed on the crystalline silicon thin film 104, an insulating layer 107 formed on the amorphous silicon thin film 105, and a source electrode 108S and a drain electrode 108D that are formed above the amorphous silicon thin film 105 with the insulating layer 107 interposed therebetween. Furthermore, the thin-film transistor device 100 according to the present embodiment includes a pair of contact layers 106 that is formed between the amorphous silicon thin film 105 and the source electrode 108S or the drain electrode 108D, and is located above the crystalline silicon thin film 104. Hereinafter, the structural elements of the thin-film transistor device 100 according to the present embodiment will be described in detail.

A substrate 101 is a glass substrate made of, for example, a glass material such as quartz glass, alkali-free glass, or high-temperature resistant glass. In order to prevent the impurities contained in the glass substrate such as sodium and phosphorus from entering the crystalline silicon thin film 104, an undercoat layer made of a silicon nitride film ($SiN_x$), an silicon oxide film ($SiO_y$), silicon oxynitride film ($SiO_yN_x$) or the like may be formed on the substrate 101. The undercoat layer also functions to alleviate the influence of heat on the substrate 101 during high-temperature heat treatment process such as laser annealing. The undercoat layer has a thickness of, for example, about 100 nm or more and 2000 nm or less.

The gate electrode 102 is pattern-formed to have a predetermined shape on the substrate 101. The gate electrode 102 may have a monolayer structure or a multilayer structure made of a conductive material or an alloy of conductive materials. The gate electrode 102 is made of, for example, molybdenum (Mo), aluminum (Al), copper (Cu), tungsten (W), titanium (Ti), chromium (Cr), molybdenum tungsten (MoW), or the like. The gate electrode 102 has a thickness of, for example, about 20 nm or more and 500 nm or less.

The gate insulating film 103 is formed on the gate electrode 102. In the present embodiment, the gate insulating film 103 is formed on the entire surface of the substrate 101 so as to cover the gate electrode 102. The gate insulating film 103 is made of, for example, a monolayer film made of silicon oxide ($SiO_y$), silicon nitride ($SiN_x$), silicon oxynitride ($SiO_yN_x$), aluminum oxide ($AlO_z$), or tantalum oxide ($TaO_w$), or a laminated film of such films. The gate insulating film 103 has a thickness of, for example, 50 nm or more and 300 nm or less.

In the present embodiment, the crystalline silicon thin film 104 is included as a channel layer, and it is thus preferable to use silicon oxide in the gate insulating film 103 that forms an interface with the channel layer. This is because it is preferable to bring the interface between the crystalline silicon thin film 104 and the gate insulating film 103 into a good condition in order to maintain good threshold voltage characteristics and achieve a high mobility in the thin-film transistor device 100, and silicon oxide is suitable for this purpose.

The crystalline silicon thin film 104 is a first channel layer made of a semiconductor film formed on the gate insulating film 103, and includes a predetermined channel region that is a region where the migration of carriers is controlled by the voltage of the gate electrode 102. The channel region is a region located above the gate electrode 102, and the length of the channel region in the direction of migration of electric charges corresponds to the gate length. The crystalline silicon thin film 104 can be formed by, for example, crystallizing non-crystalline amorphous silicon (amorphous silicon).

The crystalline silicon in the crystalline silicon thin film 104 has an average crystal grain size of about 50 nm or more and 300 nm or less. The crystalline silicon thin film 104 has a thickness of, for example, about 20 nm or more and 100 nm or less. The crystallinity of the crystalline silicon thin film 104 can be expressed as follows. To be specific, the half-width (hereinafter also referred to as "Raman half-width") of the Raman band corresponding to a phonon mode specific to the crystalline silicon thin film 104 is 5.0 $cm^{-1}$ or more and 6.0 $cm^{-1}$ or less. As used herein, the "phonon mode specific to the crystalline silicon thin film 104" refers to a transverse optical (TO) phonon mode.

The crystallinity of the crystalline silicon thin film 104 may be expressed in a different manner. For example, it is possible to use the ratio between the Raman half-width of the crystalline silicon thin film 104 and the Raman half-width of monocrystalline silicon that satisfies a range of 1.5 to 1.8. Alternatively, it is possible to use the difference between the Raman half-width of the crystalline silicon thin film 104 and the Raman half-width of a monocrystalline silicon substrate that satisfies a range of 1.8 $cm^{-1}$ or more and 2.4 $cm^{-1}$ or less. Furthermore, it is possible to use the (peak value-to-Raman half-width) ratio between the peak value in the Raman band of the crystalline silicon thin film 104 and the Raman half-width of a polycrystalline silicon thin film that satisfies a range of 0.1 to 0.2. The peak position in the Raman band of the crystalline silicon thin film 104 is observed at 516 $cm^{-1}$ or more and 518 $cm^{-1}$ or less, and monocrystalline silicon (c-Si) has a Raman half-width value of 3.4 $cm^{-1}$.

Also, the crystals of the crystalline silicon thin film 104 are predominantly oriented in the (100) direction, and not in the (111) direction.

The crystalline silicon thin film 104 is configured as described above, and thus the field-effect mobility of the crystalline silicon thin film 104 is 20 $cm^2/VS$ or more and 50 $cm^2/VS$ or less. Hereinafter, the unit "$cm^2/(V \cdot s)$" is expressed as $cm^2/VS$.

The amorphous silicon thin film 105 is, for example, an example of a semiconductor film, and is a second channel layer formed on the crystalline silicon thin film 104 including a channel region. The amorphous silicon thin film 105 according to the present embodiment is made of an intrinsic amorphous silicon film. The amorphous silicon thin film 105 according to the present embodiment has a thickness of, for example, 10 nm or more and 40 nm or less. The amorphous silicon thin film 105 functions to alleviate field crowding at the drain edge during operation of the transistor. That is, the amorphous silicon thin film 105 functions as an electric field alleviating layer.

The insulating layer 107 is an example of a channel protection layer, and protects the channel layers (the crystalline silicon thin film 104 and the amorphous silicon thin film 105). The insulating layer 107 functions as a channel etching stopper (CES) layer for preventing the amorphous silicon thin film 105 from being etched when a pair of contact layers 106 are formed. The insulating layer 107 is located above the crystalline silicon thin film 104 including a channel region, and is formed on the amorphous silicon thin film 105.

The insulating layer 107 is an organic material layer made of an organic material composed mainly of organic materials including silicon, oxygen and carbon, or an inorganic material layer made of an inorganic material such as silicon oxide ($SiO_x$) or silicon nitride ($SiN_y$). The insulating layer 107 has insulating properties, and the pair of contact layers 106 are not electrically connected to each other.

The pair of contact layers 106 are made of an amorphous semiconductor film containing an impurity at a high concentration, and are formed above the crystalline silicon thin film 104 and the amorphous silicon thin film 105 with the insulating layer 107 interposed therebetween. The pair of contact layers 106 are made of, for example, an n-type semiconductor layer containing amorphous silicon doped with phosphorus (P) as an impurity, and an $n^+$ layer containing an impurity at a concentration as high as $1\times10^{19}$ [$atm/cm^3$] or more. In the case of producing a P-type TFT, a P-type contact layer doped with an impurity such as boron (B) may be formed as the contact layer 106.

The pair of contact layers 106 face each other with a predetermined interval interposed therebetween on the insulating layer 107. Each of the pair of contact layers 106 is formed so as to extend from the upper surface of the insulating layer 107 to the amorphous silicon thin film 105. In the present embodiment, one of the pair of contact layers 106 is formed so as to extend from one end of the insulating layer 107 to the amorphous silicon thin film 105, and is formed so as to cover the top and the side of the insulating layer 107 at the one end thereof, as well as the upper surface of the amorphous silicon thin film 105 in a lateral region extending from the one end of the insulating layer 107. The other one of the pair of contact layers 106 is formed so as to extend from the other end of the insulating layer 107 to the amorphous silicon thin film 105, and is formed so as to cover the top and the side of the insulating layer 107 at the other end thereof, as well as the upper surface of the amorphous silicon thin film 105 in a lateral region extending from the other end of the insulating layer 107. The contact layers 106 may have a thickness of, for example, 5 nm or more and 100 nm or less.

The pair of contact layers 106 according to the present embodiment are formed between the amorphous silicon thin film 105 and the source electrode 108S/the drain electrode 108D, but are not formed on the side surfaces of the amorphous silicon thin film 105 and the side surfaces of the crystalline silicon thin film 104. The pair of contact layers 106 are formed so as to be flush with the amorphous silicon thin film 105 and the crystalline silicon thin film 104.

The pair of contact layers 106 may be composed of two layers including a low-concentration electric field alleviating layer (n⁻ layer) serving as a lower layer, and a high-concentration contact layer (n⁺ layer) serving as an upper layer. The low-concentration electric field alleviating layer is doped with phosphorus at a concentration of about $1 \times 10^{17}$ [atm/cm$^3$]. The two layers can be formed continuously by using a chemical vapor deposition (CVD) apparatus.

The pair of the source electrode 108S and the drain electrode 108D are located above the crystalline silicon thin film 104 and the amorphous silicon thin film 105 so as to face each other with a predetermined interval interposed therebetween, and are formed on the pair of contact layers 106 so as to be flush with the pair of contact layers 106.

The source electrode 108S is formed so as to extend from one (one end) of the ends of the insulating layer 107 to the amorphous silicon thin film 105 via one of the contact layers 106. The drain electrode 108D is formed so as to extend from another end (the other end) of the insulating layer 107 to the amorphous silicon thin film 105 via the other contact layer 106.

In the present embodiment, the source electrode 108S and the drain electrode 108D may each have a monolayer structure or a multilayer structure made of a conductive material or an alloy of conductive materials, and made of a material such as, for example, aluminum (Al), molybdenum (Mo), tungsten (W), copper (Cu), titanium (Ti), or chromium (Cr). In the present embodiment, the source electrode 108S and the drain electrode 108D have a three-layer structure of MoW, Al, and MoW. The source electrode 108S and the drain electrode 108D may have a thickness of, for example, about 100 nm or more and 500 nm or less.

The thin-film transistor device 100 is manufactured in the manner described above.

In the thin-film transistor device 100, the crystalline silicon thin film 104 configured as a channel layer has a half-width of the Raman band corresponding to a phonon mode specific thereto that satisfies a range of about 5.0 cm$^{-1}$ or more and 6.0 cm$^{-1}$ or less, and an average crystal grain size that satisfies a range of about 50 nm or more and 300 nm or less.

As a result, the thin-film transistor device 100 can include a high-mobility crystalline silicon thin film whose mobility varies little as a channel layer.

The thin-film transistor device 100 is formed by using a crystalline silicon thin film 104 selected during the manufacturing process thereof described later, the selected crystalline silicon thin film 104 being a crystalline silicon thin film that satisfies at least a half-width of the Raman band corresponding to a phonon mode specific thereto of 5.0 cm$^{-1}$ or more and 6.0 cm$^{-1}$ or less.

Next, a method for manufacturing a thin-film transistor device 100 according to the present embodiment will be described with reference to FIGS. 2A to 2K. FIGS. 2A to 2K are cross-sectional views schematically showing the steps of the method for manufacturing a thin-film transistor device according to the present embodiment.

Figure 2A:
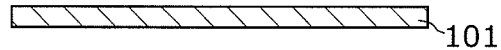
FIG. 2A is a cross-sectional view schematically showing a substrate preparation step of a method for manufacturing a thin-film transistor device according to Embodiment 1.

First, as shown in FIG. 2A, a substrate 101 is prepared. As the substrate 101, for example, a glass substrate is used. Before forming a gate electrode 102, an undercoat layer made of a silicon nitride film, a silicon oxide film, a silicon oxynitride film or the like may be formed on the substrate 101 by plasma CVD or the like.

Figure 2B:
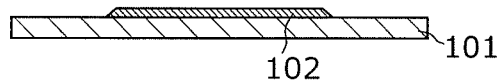
FIG. 2B is a cross-sectional view schematically showing a gate electrode forming step of the method for manufacturing a thin-film transistor device according to Embodiment 1.

Next, as shown in FIG. 2B, a gate electrode 102 having a predetermined shape is pattern-formed above the substrate 101. For example, a gate metal film made of molybdenum tungsten (MoW) or the like is formed on the entire surface of the substrate 101 by sputtering. Then, patterning is performed on the gate metal film through photolithography and wet etching, and thereby a gate electrode 102 having a predetermined shape is formed. The wet etching of MoW is performed by using, for example, a chemical solution obtained by mixing phosphoric acid (HPO$_4$), nitric acid (HNO$_3$), acetic acid (CH$_3$COOH) and water at a predetermined ratio.

Figure 2C:
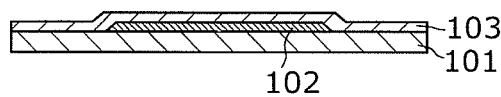
FIG. 2C is a cross-sectional view schematically showing a gate insulating film forming step of the method for manufacturing a thin-film transistor device according to Embodiment 1.

Next, as shown in FIG. 2C, a gate insulating film 103 is formed above the substrate 101. For example, a gate insulating film 103 made of silicon oxide is formed on the entire surface of the substrate 101 by plasma CVD or the like so as to cover the gate electrode 102. The silicon oxide film can be formed by, for example, introducing a silane gas (SiH$_4$) and a nitrous oxide gas (N$_2$O) at a predetermined concentration ratio.

Figure 2D:
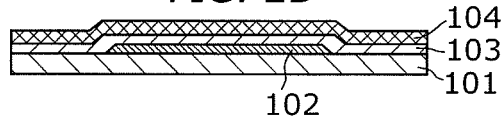
FIG. 2D is a cross-sectional view schematically showing a crystalline silicon layer forming step of the method for manufacturing a thin-film transistor device according to Embodiment 1.

Next, as shown in FIG. 2D, a crystalline silicon thin film 104 made of crystalline silicon is formed on the gate insulating film 103. To be specific, the crystalline silicon thin film 104 is formed by first forming a non-crystalline silicon thin film made of, for example, amorphous silicon (non-crystalline silicon) on the gate insulating film 103 by plasma CVD or the like, which is then subjected to a dehydrogenation annealing treatment, and thereafter laser annealing the non-crystalline silicon thin film so as to crystallize the non-crystalline silicon thin film. The non-crystalline silicon thin film can be formed by, for example, introducing a silane gas (SiH$_4$) and a hydrogen gas (H$_2$) at a predetermined concentration ratio.

In the present embodiment, the non-crystalline silicon thin film is crystallized by laser annealing with a green laser, but the crystallization method may be a laser annealing method using a pulse laser having a wavelength of about 370 nm or more and 900 nm or less, or a laser annealing method using a continuous wave laser having a wavelength of about 370 nm or more and 900 nm or less.

After that, the crystalline silicon thin film 104 is subjected to a hydrogen plasma treatment so as to hydrogenate the silicon atoms in the crystalline silicon thin film 104. The hydrogen plasma treatment is performed by, for example, generating a hydrogen plasma by application of radio frequency (RF) power by using a gas containing a hydrogen gas such as H$_2$, or H$_2$/argon (Ar) as a raw material, and irradiating the crystalline silicon thin film 104 with the hydrogen plasma. Through the hydrogen plasma treatment, dangling bonds (defects) of silicon atoms are hydrogen-terminated, reducing the crystal defect density of the crystalline silicon thin film 104, and improving the crystallinity of the crystalline silicon thin film 104.

In the present embodiment, subsequently, testing is performed to determine whether the crystalline silicon thin film has a half-width of the Raman band corresponding to a phonon mode specific thereto that satisfies a range of $5.0\,\mathrm{cm}^{-1}$ or more and $6.0\,\mathrm{cm}^{-1}$ or less, and an average crystal grain size that satisfies a range of about 50 nm or more and 300 nm or less. As a result of testing, only a crystalline silicon thin film 104 that has satisfied the above condition is selected. In this way, only a high-mobility crystalline silicon thin film 104 whose mobility varies little is selected and sent to the subsequent step. The crystalline silicon thin film 104 selected in the manner described above has an average crystal grain size of about 50 nm or more and 300 nm or less.

The method for selecting a high-mobility crystalline silicon thin film 104 whose mobility varies little is not limited thereto. That is, it is possible to select a crystalline silicon thin film 104 having a ratio between the Raman half-width of the crystalline silicon thin film 104 and the Raman half-width of monocrystalline silicon that satisfies a range of 1.5 or more and 1.8 or less, or a crystalline silicon thin film 104 having a difference between the Raman half-width of a crystalline silicon thin film 104 and the Raman half-width of the monocrystalline silicon substrate that satisfies a range of $1.8\,\mathrm{cm}^{-1}$ or more and $2.4\,\mathrm{cm}^{-1}$ or less. Alternatively, it is possible to select a crystalline silicon thin film 104 having a (peak value-to-Raman half-width) ratio between the peak value of the Raman band of the crystalline silicon thin film 104 and the Raman half-width of a polycrystalline silicon thin film that satisfies a range of 0.1 to 0.2. The peak position in the Raman band of the crystalline silicon thin film 104 is observed at $516\,\mathrm{cm}^{-1}$ or more and $518\,\mathrm{cm}^{-1}$ or less, and monocrystalline silicon (c-Si) has a Raman half-width value of $3.4\,\mathrm{cm}^{-1}$.

Figure 2E:
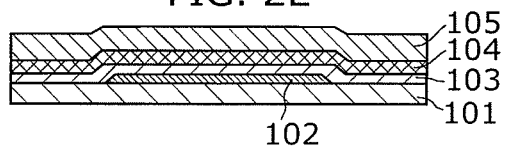
FIG. 2E is a cross-sectional view schematically showing an amorphous silicon layer forming step of the method for manufacturing a thin-film transistor device according to Embodiment 1.

Next, as shown in FIG. 2E, an amorphous silicon thin film 105 is formed on the crystalline silicon thin film 104. To be specific, after the crystalline silicon thin film 104 has been formed, an amorphous silicon thin film 105 made of an amorphous silicon film is formed under a predetermined film-forming condition (formation condition) by using plasma CVD or the like.

Figure 2F:
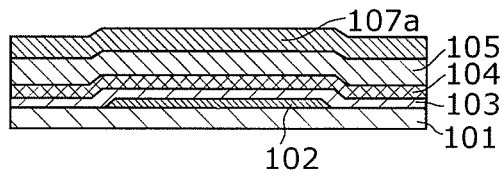
FIG. 2F is a cross-sectional view schematically showing an insulating layer forming film forming step of the method for manufacturing a thin-film transistor device according to Embodiment 1.

Next, as shown in FIG. 2F, an insulating layer forming film 107a for forming an insulating layer 107 is formed on the amorphous silicon thin film 105. The insulating layer forming film 107a is formed by using an inorganic material. In the case where, for example, the insulating layer forming film 107a is formed by using an inorganic material such as silicon oxide, a resist layer (not shown) having a predetermined width is formed on the insulating layer forming film 107a as a photomask for defining an insulating layer 107 having a predetermined shape.

Figure 2G:
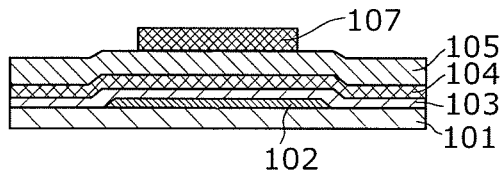
FIG. 2G is a cross-sectional view schematically showing a protrusion forming step (etching step) of the method for manufacturing a thin-film transistor device according to Embodiment 1.

Next, dry etching is performed by using the resist layer as a mask, and as shown in FIG. 2G, patterning is performed on the insulating layer forming film 107a so as to form an insulating layer 107 having a predetermined shape. Subsequently, the resist layer formed on the insulating layer 107 is removed. Through this step, the upper surface of the insulating layer 107 is exposed.

Figure 2H:
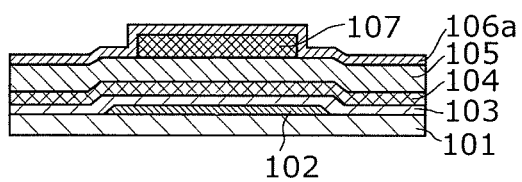
FIG. 2H is a cross-sectional view schematically showing a contact layer forming film forming step of the method for manufacturing a thin-film transistor device according to Embodiment 1.

Next, as shown in FIG. 2H, a contact layer forming film 106a for forming a contact layer 106 is formed on the amorphous silicon thin film 105 so as to cover the insulating layer 107. To be specific, a contact layer forming film 106a made of amorphous silicon doped with an impurity made of a pentavalent element such as phosphorus is formed by, for example, plasma CVD such that the contact layer forming film 106a extends from the upper surface of the insulating layer 107 to the flat portions of the amorphous silicon thin film 105.

The contact layer forming film 106a may be composed of two layers including a low-concentration electric field alleviating layer, and a high concentration contact layer. The low-concentration electric field alleviating layer can be formed by doping the layer with phosphorus at a concentration of about $1\times10^{17}$ [atm/cm$^3$]. The two layers can be formed continuously by using a CVD apparatus.

Figure 2I:
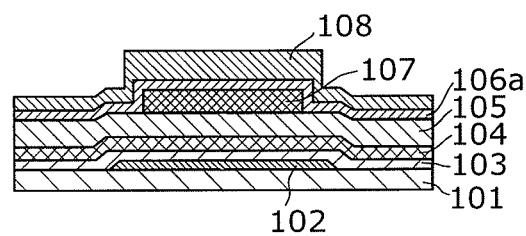
FIG. 2I is a cross-sectional view schematically showing a source drain metal film forming step of the method for manufacturing a thin-film transistor device according to Embodiment 1.

Next, as shown in FIG. 2I, a source drain metal film 108 for forming a source electrode 108S and a drain electrode 108D is formed so as to cover the contact layer forming film 106a. For example, a source drain metal film 108 having a three-layer structure of MoW, Al, and MoW is formed by sputtering.

After that, although not shown, in order to form a source electrode 108S and a drain electrode 108D having a predetermined shape, a resist material is applied onto the source drain metal film 108, which is then exposed to light and developed so as to form a resist layer patterned in a predetermined shape.

Figure 2J:
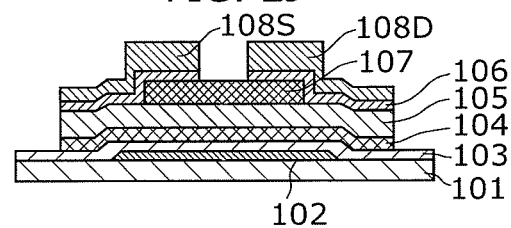
FIG. 2J is a cross-sectional view schematically showing a source electrode/drain electrode forming step of the method for manufacturing a thin-film transistor device according to Embodiment 1.

Next, wet etching is performed by using the resist layer as a mask so as to perform patterning on the source drain metal film 108, and thereby as shown in FIG. 2J, a source electrode 108S and a drain electrode 108D having a predetermined shape are formed. At this time, the contact layer forming film 106a functions as an etching stopper. After that, the resist layer formed on the source electrode 108S and the drain electrode 108D is removed. Also, dry etching is performed by using the source electrode 108S and the drain electrode 108D as a mask so as to perform patterning on the contact layer forming film 106a, and thereby a pair of contact layers 106 having a predetermined shape are formed. As a condition for dry etching, a chlorine-based gas can be used.

In this way, the thin-film transistor device 100 according to the present embodiment can be manufactured.

Figure 2K:
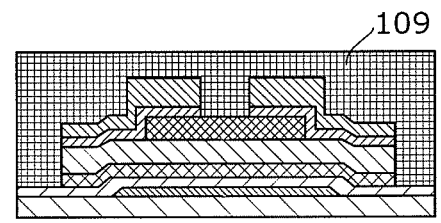
FIG. 2K is a cross-sectional view schematically showing a passivation film forming step of the method for manufacturing a thin-film transistor device according to Embodiment 1.

After that, as shown in FIG. 2K, it is also possible to form a passivation film 109 made of an inorganic material such as SiN so as to entirely cover the source electrode 108S and the drain electrode 108D.

In the foregoing description, in order to simplify the description, a method for manufacturing a single thin-film transistor device is illustrated, but the present disclosure is not limited thereto. A plurality of thin-film transistor devices may be manufactured in an array, instead of manufacturing a single thin-film transistor device. In this case, in the step shown in FIG. 2D, testing is performed on one of a plurality of crystalline silicon thin films 104 formed in an array. Then, as a result of testing, only an array including a crystalline silicon thin film 104 that satisfies the above-described condition may be selected. It is thereby possible to configure a plurality of thin-film transistor devices by using a high-mobility crystalline silicon thin film whose mobility varies little, as a result of which an advantageous effect is obtained in that the thin-film transistor devices can be used in an organic EL panel for use as a large screen.

Subsequently, a method for selecting only a high-mobility crystalline silicon thin film 104 whose mobility varies little will be described with reference to FIG. 2D.

Figure 3:
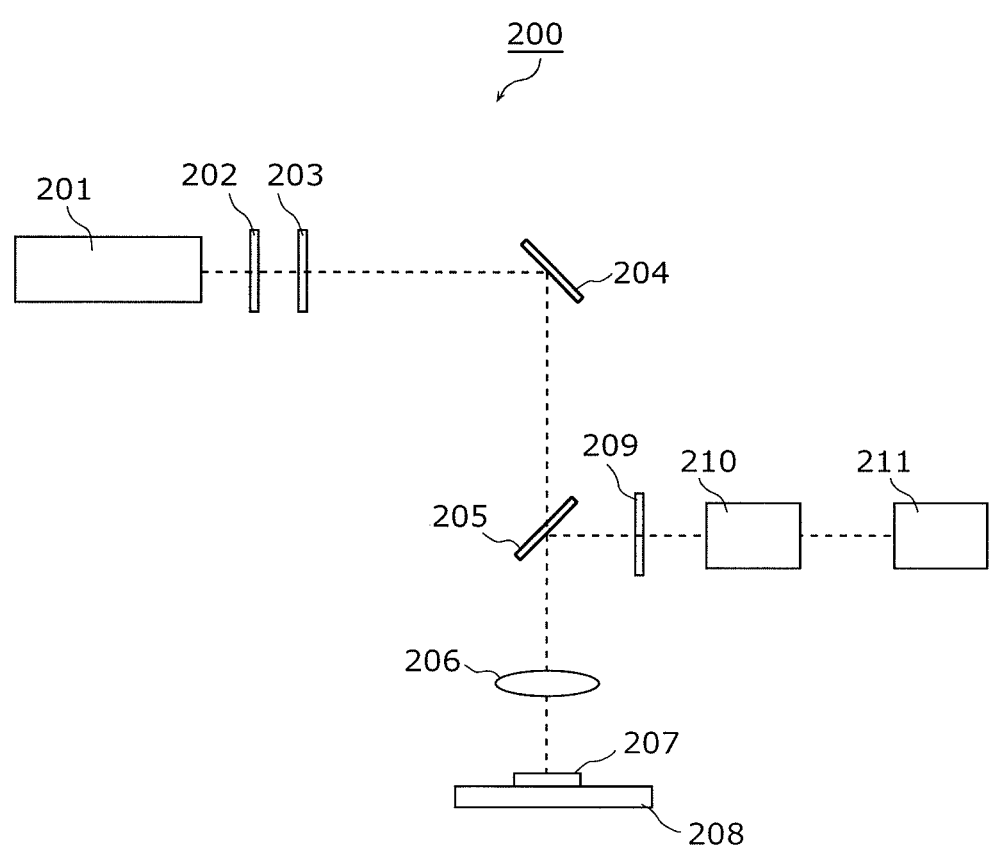
FIG. 3 is a diagram showing an overview of a Raman spectroscopic apparatus used to evaluate the film quality of a crystalline semiconductor film according to Embodiment 1

FIG. 3 is a diagram showing an overview of a Raman spectroscopic apparatus 200 used to evaluate the film quality of a crystalline silicon thin film according to the present embodiment. For example, the evaluation (testing) of a crystalline silicon thin film 104 with respect to the half-width of the Raman band corresponding to a phonon mode specific to the crystalline silicon thin film 104 is performed by using, for example, a Raman spectroscopic apparatus shown in FIG. 3. Hereinafter, a Raman spectroscopic apparatus 200 shown in FIG. 3 will be described.

The Raman spectroscopic apparatus 200 shown in FIG. 3 includes a light source 201, an attenuator 202, a filter 203, a mirror 204, a beam splitter 205, an objective lens 206, a stage 208, a slit 209, a spectroscope 210, and a detector 211. The Raman spectroscopic apparatus 200 performs Raman spectroscopic measurement on a sample 207. The sample 207 is a sample obtained by forming a crystalline silicon thin film on the gate electrode by the above-described manufacturing method, or an equivalent thereof.

The light source 201 uses laser light having a wavelength of about 470 nm or more and 700 nm or less. For example, the light source 201 may be an argon ion laser having a wavelength of 514.5 nm, a YAG laser having a wavelength of 532 nm, or the like.

The attenuator 202 attenuates the laser light emitted from the light source 201 to a level that does not affect the sample 207.

The filter 203 allows the light attenuated by the attenuator 202 to pass therethrough while removing light other than that having a desired wavelength.

In the present embodiment, the power of laser is adjusted by the magnification of each objective lens included in the light source 201 and the attenuator 202, such that the spectrum of the sample 207 is not changed. For example, in the case where the magnification of each objective lens is set to 50 times, the power of laser on the sample 207 is adjusted to 1 mW to 20 mW.

The mirror 204 controls the traveling direction of the light that has passed through the filter 203.

The beam splitter 205 guides the light whose traveling direction has been controlled by the mirror 204 to the objective lens 206 of the microscope system. The beam splitter 205 also guides scattered light scattered on the surface of the sample 207 and converged by the objective lens 206 to the spectroscope 210 via the slit 209.

The objective lens 206 converges the light guided via the beam splitter 205, and applies the light to the sample 207 placed on the stage 208. The objective lens 206 can change the laser light illuminated spot (spatial resolution) on the surface of the sample 207 by changing the magnification of the objective lens 206. In the case where, for example, the magnification of the objective lens 206 is set to 100 times, the diameter of the laser light illuminated spot on the surface of the sample 207 is set to about 0.6 μm.

The objective lens 206 also converges scattered light scattered on the surface of the sample 207, and guides the scattered light to the beam splitter 205.

The slit 209 improves the spectral resolution of light that passes therethrough by its width (slit width). A small slit width improves the spectral resolution, but reduces the intensity of scattered light. Accordingly, it is necessary to set the slit width as appropriate for each apparatus in consideration of the balance between the resolution and S/N. In the present embodiment, the slit width is set to, for example, about 20 μm or more and 200 μm or less.

The spectroscope 210 is an apparatus for obtaining a spectrum (dispersed light) by decomposing light into different wavelengths. The spectroscope 210 disperses the light guided via the slit 209. As the spectroscope 210, a single monochrometer is commonly used. Increasing the number of gratings formed in the spectroscope 210 improves the resolution, but the region where the spectrum is obtained is reduced, and the intensity of scattered light is reduced. For this reason, it is necessary to choose the number of gratings (the number of openings) as appropriate according to the measurement target. In the present embodiment, a monochrometer having, for example, gratings of about 1800 G/mm or more and 3000 G/mm or less is used.

The detector 211 detects the light dispersed by the spectroscope 210 as a signal so as to obtain a Raman spectrum. The detector 211 is constituted by using, for example, a photomultiplier and a charge coupled device (CCD). The distance between the spectroscope 210 and the detector 211 is called "focal length". A long focal length improves the frequency resolution of the spectrum, but attenuates the intensity of scattered light. Accordingly, in the present embodiment, the focal length is set to about 250 mm or more and 500 mm or less.

The Raman spectroscopic apparatus 200 has the above-described configuration. A Raman spectrum obtained by using the Raman spectroscopic apparatus 200 is fed into a computer in which an analyzing program is installed, and then analyzed.

Next is a description of a method for analyzing a Raman spectrum obtained by using the Raman spectroscopic apparatus 200 described above.

Figure 4:
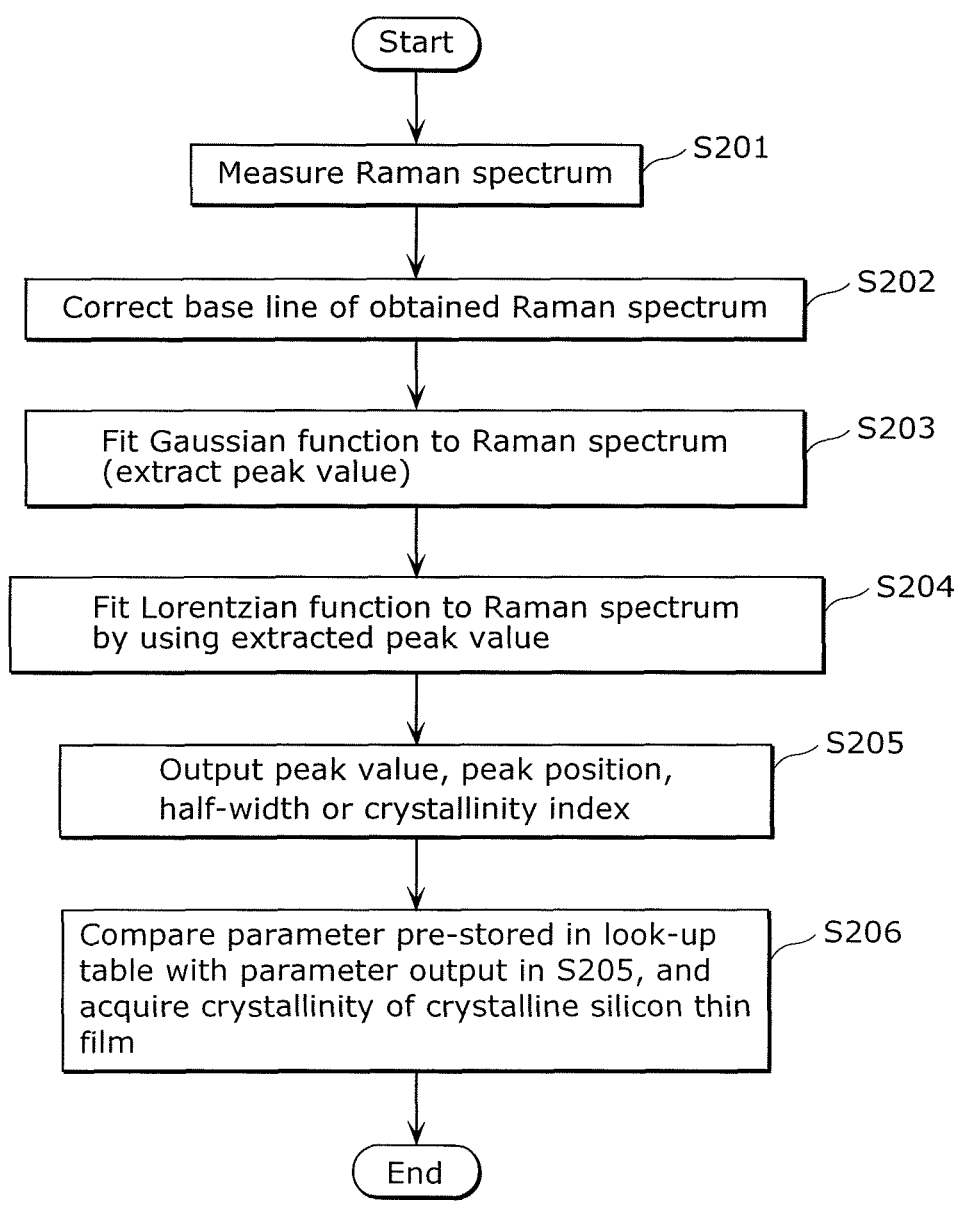
FIG. 4 is a flowchart illustrating a Raman spectrum analysis method used in a method for analyzing the film quality of a crystalline semiconductor film according to Embodiment 1.
Figure 5:
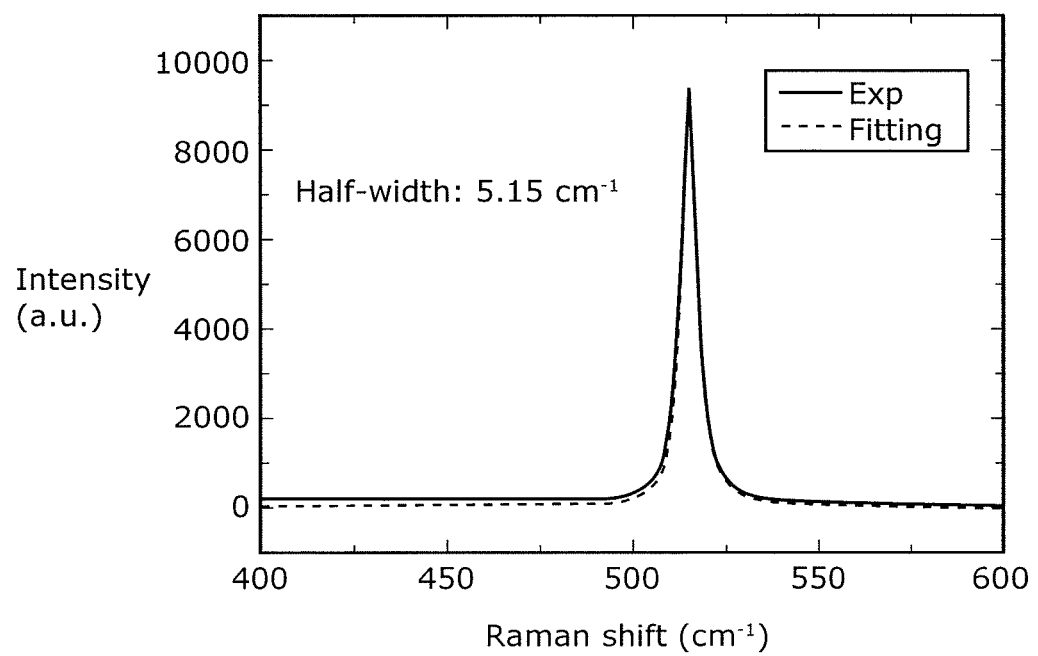
FIG. 5 is a diagram showing a Raman spectrum of a crystalline silicon thin film according to Embodiment 1 and a result of analysis thereof.

FIG. 4 is a flowchart illustrating a method for analyzing a Raman spectrum according to the present embodiment. FIG. 5 is a diagram showing a Raman spectrum of a crystalline silicon thin film according to the present embodiment and a result of analysis thereof.

First, a Raman spectrum is measured by using the Raman spectroscopic apparatus 200 (S201). To be specific, a peak waveform of the Raman band corresponding to a phonon mode specific to the crystalline silicon thin film is measured by Raman spectroscopy. The Raman spectroscopy is a measurement method that utilizes the fact that a Raman shift is specific to a material, and in which laser light is applied to a sample to measure generated Raman scattered light, and thereby microscopic physical properties can be obtained through non-destructive and non-contact measurement. As the measurement conditions, the measurement position is on the crystalline silicon thin film formed on the gate electrode, and the excitation wavelength is set to 532 nm. The diameter of the measurement spot is set to 1.3 pmt, and the frequency resolution is set to 1.5 $cm^{-1}$.

The peak of the Raman band corresponding to a phonon mode specific to the crystalline silicon thin film is observed in a range of 516 $cm^{-1}$ or more and 518 $cm^{-1}$ or less. With the crystalline silicon film, the peak of the Raman band corresponding to a phonon mode specific to silicon is observed in a region of 450 $cm^{-1}$ or more and 550 $cm^{-1}$ or less, the peak of the Raman band corresponding a phonon mode specific to a microcrystalline silicon film is observed around 500 $cm^{-1}$ or more and 510 $cm^{-1}$ or less, and the peak of the Raman band corresponding to a phonon mode specific to an a-Si film is observed around 480 $cm^{-1}$. In the present embodiment, among the measured spectra (Raman spectra), analysis was performed on the peak waveform of the Raman band corresponding to a phonon mode specific to the crystalline silicon thin film.

Next, the base line of the obtained Raman spectrum is corrected (S202). To be specific, the peak waveform of the Raman band corresponding to a phonon mode specific to the crystalline silicon thin film is measured, and thereafter the base line of the obtained peak waveform is corrected. The correction of the base line is performed by, for example, a method in which straight line approximation is performed on an analyzed region in the Raman spectrum. This is because the Raman spectrum is affected by the sample (in this example, the sample 207) and the measurement environment, resulting in an inclined base line. In the case where the base line is not inclined, it is unnecessary to correct the base line.

Next, fitting is performed on the obtained Raman spectrum by using a Gaussian function (S203).

To be specific, a Raman peak waveform analysis model is generated by using a Gaussian function (Gaussian distribution), and fitting (reproduction of Raman spectrum) is performed on the generated Raman peak waveform analysis model with respect to the height direction, so as to extract an intensity (peak value). In the present embodiment, a Raman peak waveform analysis model of the Raman band of the crystalline silicon thin film is generated by using a Gaussian function (Gaussian distribution). Then, in the Raman spectrum whose base line has been corrected, fitting is performed on a peak in the Raman band observed in the component of the crystalline silicon thin film, or in other words, observed in a range of 516 $cm^{-1}$ or more and 518 $cm^{-1}$ or less, so as to extract an intensity (peak value).

Next, fitting is performed on the Raman spectrum to fit a Lorentzian function thereto by using the extracted peak value (S204).

To be specific, a Raman peak waveform analysis model is generated by using a Lorentzian function. Fitting is performed by using the generated Raman peak waveform analysis model with respect to the width direction of the Raman band of the crystalline silicon thin film.

That is, in the present embodiment, to the Raman band of the crystalline silicon thin film in which the base line has been corrected, first, a peak value is fitted by using a Raman peak waveform analysis model generated from the Gaussian function, and thereafter fitting is performed with respect to the width direction by using a Raman peak waveform analysis model generated from the Lorentzian function. The result of analysis is shown in FIG. 5.

Next, a parameter is extracted from the result of fitting of the Raman spectrum performed in S204, and then output. To be specific, through the spectrum analysis, or in other words, from the Raman peak waveform analysis model obtained by fitting in S204, the peak position, half-width (Raman half-width), peak value (peak intensity), volume fraction (crystallinity index) or the like of each component is extracted and output as a parameter (S205).

Next, the parameter output in S205 is compared with, for example, the parameters pre-stored in a lookup table so as to obtain a value indicating the crystallinity of the crystalline silicon thin film (S206).

As used herein, the value indicating the crystallinity of the crystalline silicon thin film is, for example, the half-width of the Raman band (Raman half-width) of the crystalline silicon thin film 104. The value may be a value indicating the ratio between the Raman half-width of the crystalline silicon thin film 104 and the Raman half-width of monocrystalline silicon, or a value indicating the difference between the half-width of the crystalline silicon thin film 104 and the Raman half-width of a monocrystalline silicon substrate. Also, for example, the value may be a value indicating the (peak value-to-Raman half-width) ratio between the peak value of the Raman band of the crystalline silicon thin film 104 and the Raman half-width of a polycrystalline silicon thin film.

The Raman spectrum obtained by the Raman spectroscopic apparatus 200 is analyzed in the manner described above so as to acquire a value indicating the crystallinity of the crystalline silicon thin film.

Next, a preferred film quality condition (a value indicating preferred crystallinity) of the crystalline silicon thin film 104 of the thin-film transistor device 100 according to the present embodiment will be described.

Figure 6:
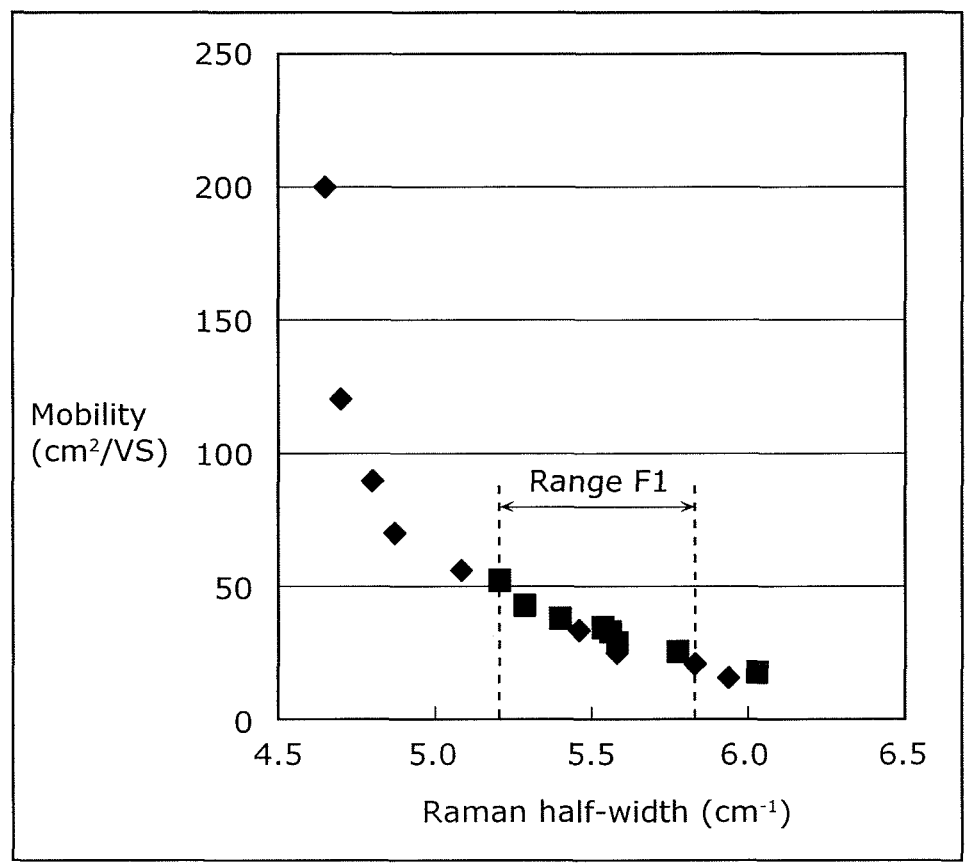
FIG. 6 is a diagram showing a relationship between the mobility of crystalline silicon thin films formed by the manufacturing method according to Embodiment 1 and the Raman half-width of the crystalline silicon thin films.
Figure 7:
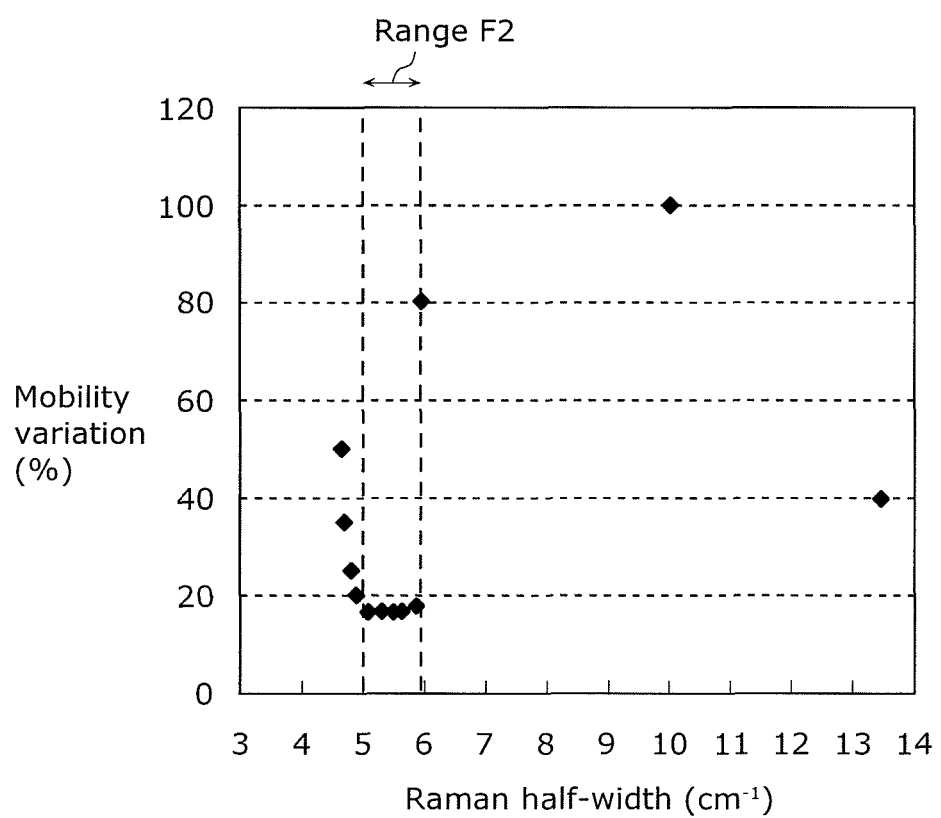
FIG. 7 is a diagram showing a relationship between the variability in the absolute value of mobility shown in FIG. 6 and the Raman half-width of the crystalline silicon thin films.

FIG. 6 is a diagram showing a relationship between the mobility of crystalline silicon thin films formed by the manufacturing method according to the present embodiment and the Raman half-width of the crystalline silicon thin films. Data points shown in FIG. 6 are respectively obtained from a plurality of samples 207 in which a crystalline silicon thin film is formed on the gate electrode by the above-described manufacturing method. In the diagram, the vertical axis indicates mobility ($cm^2/VS$), and the horizontal axis indicates the Raman half-width, specifically, the half-width ($cm^{-1}$) of the Raman band observed in a range of 516 $cm^{-1}$ or more and 518 $cm^{-1}$ or less. FIG. 7 shows the variability in the absolute value of mobility shown in FIG. 6. That is, FIG. 7 is a diagram showing a relationship between the variability in the absolute value of mobility (FIG. 6) of crystalline silicon thin films formed by the manufacturing method according to the present embodiment and the Raman half-width of the crystalline silicon thin films. In the diagram, the vertical axis indicates the variability (%) in the mobility of the crystalline silicon thin films, and the horizontal axis indicates the Raman half-width ($cm^{-1}$) of the crystalline silicon thin films.

As shown in FIG. 7, it can be seen that the range in which the mobility varies little is a range F2 in which the Raman half-width ranges from 5.2 $cm^{-1}$ to 5.8 $cm^{-1}$.

Accordingly, in FIG. 6, it can be seen that the range in which the mobility varies relatively little is a range F1 in which the mobility ranges from 20 $cm^2/VS$ to 50 $cm^2/VS$. That is, it can be seen that in the range F1 in which the Raman half-width ranges from 5.2 $cm^{-1}$ to 5.8 $cm^{-1}$, the mobility ranges from 20 $cm^2/VS$ to 50 $cm^2/VS$.

From the above, it is predicted that, as a preferred film quality condition, when the crystalline silicon thin film has a Raman half-width that satisfies a range of 5.0 $cm^{-1}$ or more and 6.0 $cm^{-1}$ or less, the crystalline silicon thin film has high mobility characteristics with little variability in mobility.

It can be seen from FIG. 7 that it is more desirable that the Raman half-width of the crystalline silicon thin film is 5.0 $cm^{-1}$ or more and less than 6.0 $cm^{-1}$. From this, it is also predicted that, as a preferred film quality condition, when the Raman half-width of the crystalline silicon thin film satisfies a range of 5.2 $cm^{-1}$ or more and 5.8 $cm^{-1}$ or less, the crystalline silicon thin film has high mobility characteristics with little variability in mobility.

This is presumably because when the Raman half-width is smaller than 5 $cm^{-1}$, the grain size of the crystalline silicon thin film increases (large grain size), and the variability in mobility increases. On the other hand, when the Raman half-width is 6 $cm^{-1}$ or more, although the grain size of the crystalline silicon thin film is small, the variability in mobility increases as a result of an explosive crystalline state (a mixed crystal of a microcrystalline structure and a partially melt structure) being mixed.

It was conventionally believed that it is preferable to use microcrystals or explosive crystals obtained by crystallization by laser light having a low energy density, or polysilicon crystals obtained by crystallization by laser light having a high energy density in transistors. The reason is as follows. That is, in the case where the Raman half-width is 5.0 $cm^{-1}$ or more and less than 6.0 $cm^{-1}$, crystalline silicon was believed to be in a melt crystalline state, and the melt-crystallized crystal structure was believed to exhibit great variability in mobility due to the influence of formation of protrusions, interface states at grain boundary, or the like.

However, in the case where the Raman half-width of the crystalline silicon thin film satisfies a range of 5.2 $cm^{-1}$ or more and less than 5.8 $cm^{-1}$, the formation of protrusions is suppressed, and the energy barrier at grain boundary is reduced due to crystal orientation being weakened. That is, by using a crystalline silicon thin film having a Raman half-width that satisfies a range of 5.2 cm$^{-1}$ to 5.8 cm$^{-1}$ in a transistor, the variability in mobility can be suppressed. The orientation of crystal structure will be described later.

Figure 8:
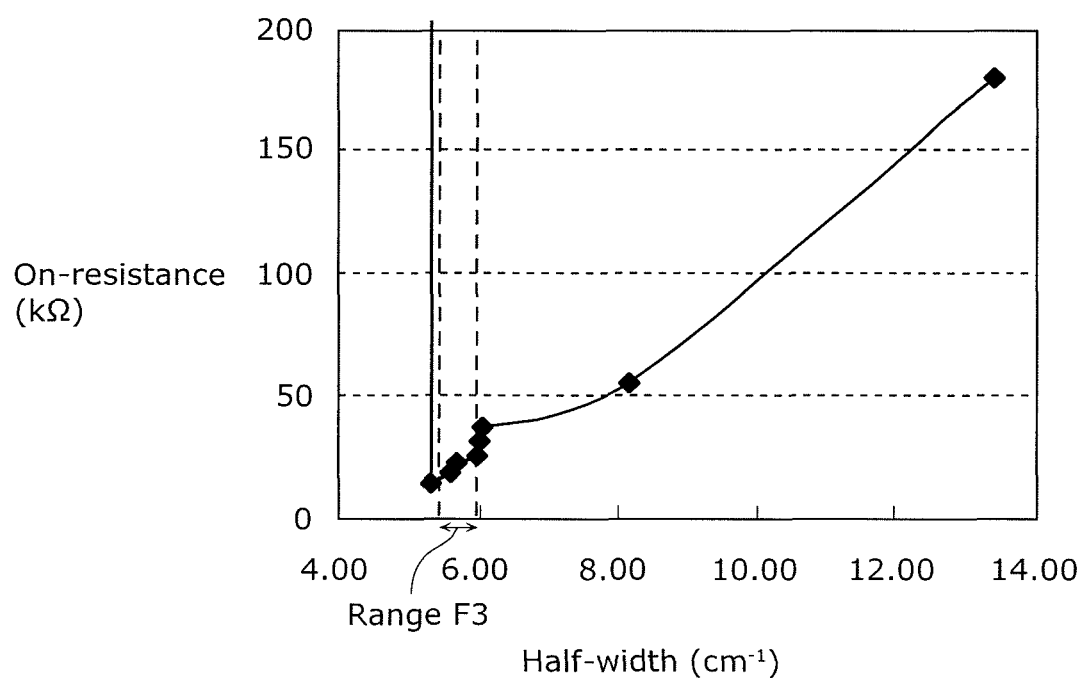
FIG. 8 is a diagram showing a relationship between the on-resistance of crystalline silicon thin films formed by the manufacturing method according to Embodiment 1 and the Raman half-width of the crystalline silicon thin films.

FIG. 8 is a diagram showing a relationship between the on-resistance of crystalline silicon thin films formed by the manufacturing method according to the present embodiment and the Raman half-width of the crystalline silicon thin films. In the diagram, the vertical axis indicates the on-resistance (kΩ) of TFTs produced by using the crystalline silicon thin films, the horizontal axis indicates the Raman half-width (cm$^{-1}$) of the crystalline silicon thin films.

As shown in FIG. 8, it can be seen that the range in which the on-resistance varies little is a range F3 in which the Raman half-width ranges from 5.2 cm$^{-1}$ to 5.8 cm$^{-1}$.

Accordingly, it can be seen that, as a preferred film quality condition, when the Raman half-width of the crystalline silicon thin film satisfies a range of 5.2 cm$^{-1}$ or more and 5.8 cm$^{-1}$ or less, the crystalline silicon thin film has a on-resistance that varies little.

Figure 9:
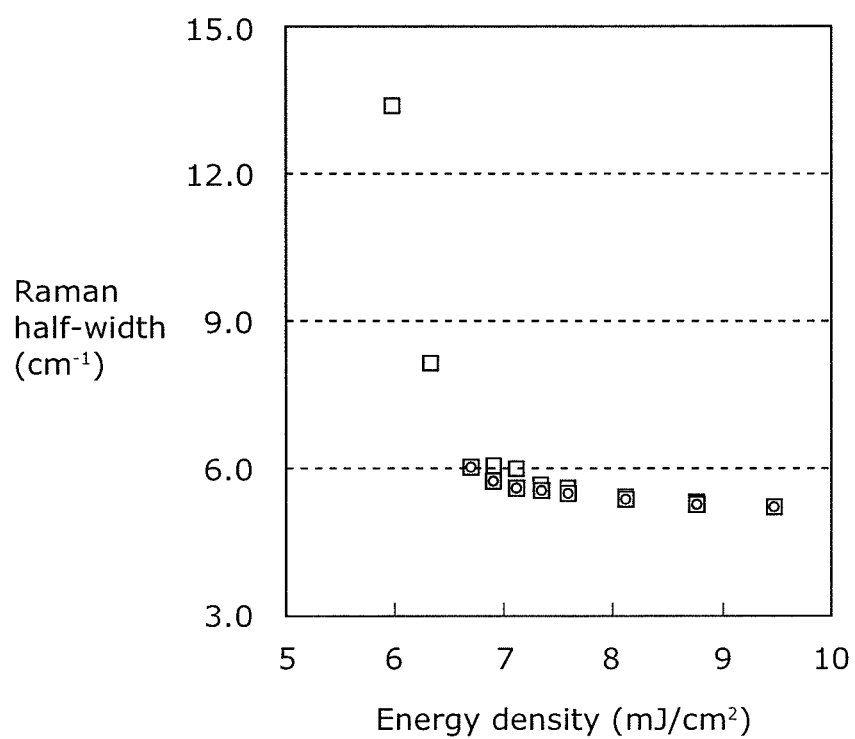
FIG. 9 is a diagram showing a relationship between the Raman half-width of crystalline silicon thin films formed by the manufacturing method according to Embodiment 1 and the energy density of green laser light applied to form the crystalline silicon thin films.

FIG. 9 is a diagram showing a relationship between the Raman half-width of crystalline silicon thin films formed by the manufacturing method according to the present embodiment and the energy density of green laser light applied to form the crystalline silicon thin films. In the diagram, the vertical axis indicates the Raman half-width (cm$^{-1}$) of the crystalline silicon thin films, and the horizontal axis indicates the energy density (mJ/cm$^2$) of green laser light applied to form the crystalline silicon thin films.

As shown in FIG. 9, in the range in which the Raman half-width ranges from 5.2 cm$^{-1}$ to 5.8 cm$^{-1}$, the energy density (mJ/cm$^2$) of green laser light applied to form the crystalline silicon thin film ranges from 6.8 mJ/cm$^2$ to 9 mJ/cm$^2$.

That is, it can be seen that there is a process margin for the energy density (mJ/cm$^2$) of green laser light for forming the crystalline silicon thin films having a Raman half-width that satisfies a range of 5.2 cm$^{-1}$ or more and 5.8 cm$^{-1}$ or less.

Figure 10:
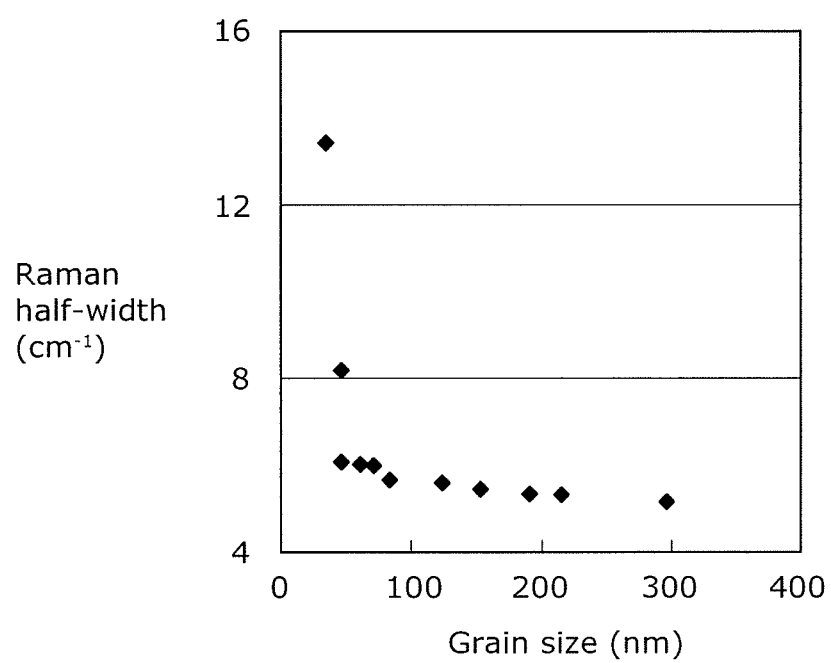
FIG. 10 is a diagram showing a relationship between the Raman half-width of crystalline silicon thin films formed by the manufacturing method according to Embodiment 1 and the crystal grain size of the crystalline silicon thin films.
Figure 11:
FIG. 11 is a scanning electron microscopic (SEM) micrograph of the crystal structure of a crystalline silicon thin film having a Raman half-width of 5.2 $cm^{-1}$ or more and 5.8 $cm^{-1}$ or less.

FIG. 10 is a diagram showing a relationship between the Raman half-width of crystalline silicon thin films formed by the manufacturing method according to the present embodiment and the crystal grain size of the crystalline silicon thin films. In the diagram, the vertical axis indicates the Raman half-width (cm$^{-1}$) of the crystalline silicon thin films, and the horizontal axis indicates the crystal grain size (nm) of the crystalline silicon thin films. FIG. 11 is a micrograph obtained by a scanning electron microscope (SEM) showing a crystal structure of the crystalline silicon thin film having a Raman half-width of 5.2 cm$^{-1}$ to 5.8 cm$^{-1}$.

As shown in FIG. 10, it can be seen that in the range in which the Raman half-width ranges from 5.2 cm$^{-1}$ to 5.8 cm$^{-1}$, the crystal grain size of the crystalline silicon thin film ranges from 30 nm to 300 nm.

That is, as a preferred film quality condition, when the Raman half-width of the crystalline silicon thin film satisfies a range of 5.2 cm$^{-1}$ or more and 5.8 cm$^{-1}$ or less, the grain size of the crystalline silicon thin film ranges from 30 nm to 300 nm as shown in FIG. 11.

Figure 12:
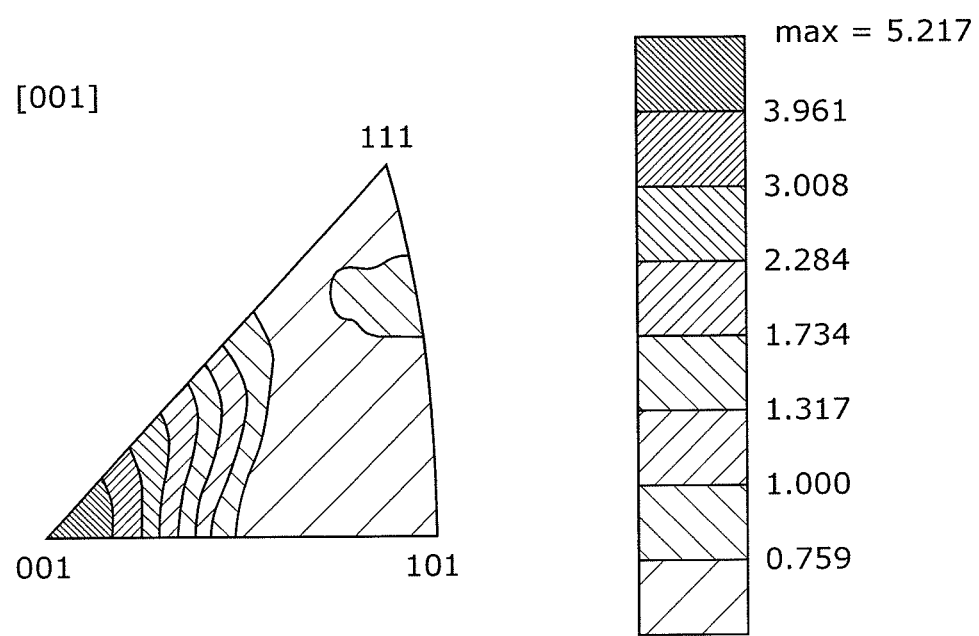
FIG. 12 is a diagram showing the crystal orientation of a crystalline silicon thin film formed by the manufacturing method according to Embodiment 1.

FIG. 12 is a diagram showing the crystal orientation of a crystalline silicon thin film formed by the manufacturing method according to the present embodiment. The crystal orientation shown in FIG. 12 is obtained by using an electron back-scattered diffraction pattern (EBSP) method that enables evaluation in a wide range to be performed with ease based on the same principles as TEM. To be specific, first, electron beams are scanned over the surface of the sample 207, and a pattern formed by inelastic scattering of the electron beams applied onto points on the surface of the sample 207 is read, whereby a two-dimensional orientation map of the sample, or in other words, a crystal orientation indicating the orientation of crystals is obtained.

As shown in FIG. 12, the crystals of the crystalline silicon thin film are predominantly oriented in the (100) direction, and not in the (111) direction.

Accordingly, as a preferred film quality condition, when the Raman half-width of the crystalline silicon thin film satisfies a range of 5.2 cm$^{-1}$ or more and 5.8 cm$^{-1}$ or less, the silicon crystals of the crystalline silicon thin film are predominantly oriented in the (100) direction, and not in the (111) direction.

In the case where a crystalline silicon thin film is formed by excimer laser light instead of green laser light, a crystalline silicon thin film whose crystals are predominantly oriented in the (111) direction is formed. In the case where a crystalline silicon thin film is formed by deposition using CVD or the like, a crystalline silicon thin film whose crystals are predominantly oriented in the (110) direction is formed.

The characteristics of the crystalline silicon thin film shown in FIG. 10 can be obtained by adjusting the laser annealing conditions such as power density and scan speed as appropriate. The laser annealing conditions for forming the crystalline silicon thin film shown in FIG. 10 include, for example, a power density of 50 kW/cm$^2$ or more and 90 kW/cm$^2$ or less, and a scan speed of 400 mm/s or more and 600 mm/s or less. If the laser annealing conditions diverge away from optimal conditions, the resulting crystalline silicon thin film does not satisfy the conditions as shown in FIG. 10 such as the Raman half-width and the crystal grain size, and thus it is necessary to optimize the annealing conditions.

The crystal orientation of the crystalline silicon thin film has an orientation intensity of 5 or less when measured by using the EBSP method, and the orientation is predominantly in the (100) direction, but exhibits a relatively weak orientation. In the case of crystals that exhibit a strong crystal orientation, the orientation intensity obtained as a result of measurement using the EBSP method is at least 10 or more. By maintaining the crystal orientation in a relatively low range, the degree of freedom of crystals in grain boundaries increases, and the variability in mobility can be reduced.

As described above, the thin-film transistor device 100 is configured by using a crystalline silicon thin film 104 having, as a preferred film quality condition, a Raman half-width corresponding to a phonon mode specific to the crystalline silicon thin film 104 that satisfies a range of 5.0 cm$^{-1}$ or more and 6.0 cm$^{-1}$ or less as a channel layer. Furthermore, in the crystalline silicon thin film 104 having, as a preferred film quality condition, a Raman half-width corresponding to a phonon mode specific to the crystalline silicon thin film 104 that satisfies a range of 5.0 cm$^{-1}$ or more and 6.0 cm$^{-1}$ or less, its average crystal grain size is about 50 nm or more and 300 nm or less, and its crystals are predominantly oriented in the (100) direction, and not in the (111) direction.

In the foregoing, the Raman half-width of the crystalline silicon thin film is used as a preferred film quality condition, or in other words, a value indicating the crystallinity of the high-mobility crystalline silicon thin film whose mobility varies little, but the present disclosure is not limited thereto. It is also possible to perform evaluation by using the ratio of the Raman half-width of the crystalline silicon thin film with respect to the Raman half-width of monocrystalline silicon (c-Si), or a value indicating the difference between the Raman half-width of the crystalline silicon thin film and the Raman half-width of monocrystalline silicon. Such examples will be described below with reference to FIGS. 13 and 14.

Figure 13:
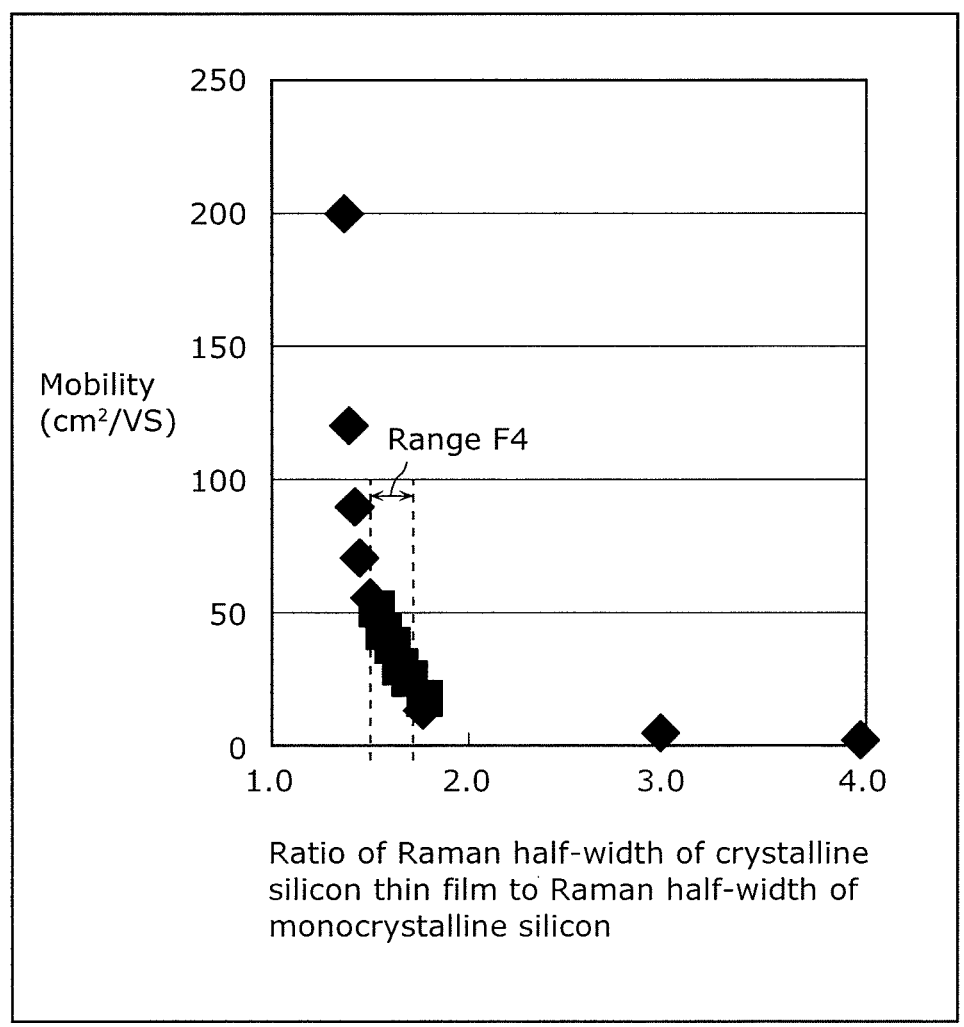
FIG. 13 is a diagram showing a relationship between the mobility of crystalline silicon thin films formed by the manufacturing method according to Embodiment 1 and the ratio of the Raman half-width of the crystalline silicon thin films with respect to the Raman half-width of monocrystalline silicon.

FIG. 13 is a diagram showing a relationship between the mobility of crystalline silicon thin films formed by the manufacturing method according to the present embodiment and the ratio of the Raman half-width of the crystalline silicon thin films with respect to the Raman half-width of monocrystalline silicon (c-Si). In the diagram, the vertical axis indicates mobility ($cm^2/VS$), and the horizontal axis indicates the ratio of the Raman half-width of the crystalline silicon thin films with respect to the Raman half-width of monocrystalline silicon (c-Si). Also, the Raman half-width of monocrystalline silicon (c-Si) is 3.4 $cm^{-1}$, and the Raman shift is the half width in the Raman band at around 520 $cm^{-1}$.

In FIG. 13, a range F4 is the range in which the mobility ranges from 20 $cm^2/VS$ to 50 $cm^2/VS$. In the range F4, the ratio of the Raman half-width of the crystalline silicon thin films with respect to the Raman half-width of monocrystalline silicon (c-Si) ranges from 1.5 to 1.8.

Accordingly, as a preferred film quality condition, when the ratio of the Raman half-width of the crystalline silicon thin film with respect to the Raman half-width of monocrystalline silicon (c-Si) satisfies a range of 1.5 or more and 1.8 or less, the crystalline silicon thin film has high mobility characteristics with little variability in mobility.

Figure 14:
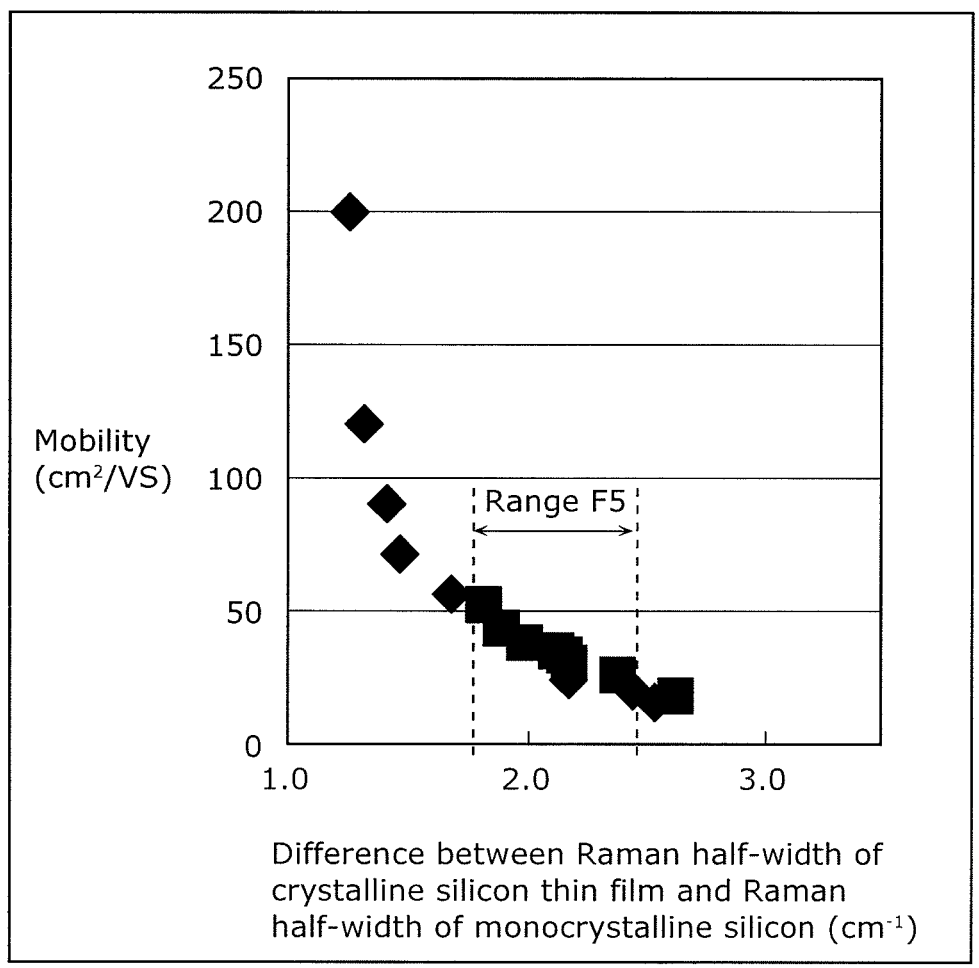
FIG. 14 is a diagram showing a relationship between the mobility of crystalline silicon thin films formed by the manufacturing method according to Embodiment 1 and the difference between the Raman half-width of the crystalline silicon thin films and the Raman half-width of monocrystalline silicon.

FIG. 14 is a diagram showing a relationship between the mobility of crystalline silicon thin films formed by the manufacturing method according to the present embodiment and the difference between the Raman half-width of the crystalline silicon thin films and the Raman half-width of monocrystalline silicon (c-Si). In the diagram, the vertical axis indicates mobility ($cm^2/VS$), and the horizontal axis indicates a value ($cm^{-1}$) obtained by subtracting the Raman half-width of monocrystalline silicon (c-Si) from the Raman half-width of the crystalline silicon thin films. Here, the value of the Raman half-width of monocrystalline silicon (c-Si) is 3.4 $cm^{-1}$.

In FIG. 14, a range F5 is the range in which the mobility ranges from 20 $cm^2/VS$ to 50 $cm^2/VS$. In the range F5, the difference between the Raman half-width of the crystalline silicon thin films and the Raman half-width of monocrystalline silicon (c-Si) ranges from 1.8 $cm^{-1}$ to 2.4 $cm^{-1}$.

Accordingly, as a preferred film quality condition, when the difference between the Raman half-width of the crystalline silicon thin film and the Raman half-width of monocrystalline silicon (c-Si) satisfies a range of 1.8 $cm^{-1}$ or more and 2.4 $cm^{-1}$ or less, the crystalline silicon thin film has high mobility characteristics with little variability in mobility.

In the foregoing, a preferred film quality condition, or in other words, a value indicating the crystallinity of the high-mobility crystalline silicon thin film whose mobility varies little is indicated by using a value calculated by using the Raman half-width of the crystalline silicon thin film, but the present disclosure is not limited thereto. Hereinafter, as an example, a case will be described in which a peak position or peak value (peak intensity) in the Raman band of the crystalline silicon thin film is used.

First, the mobility of a crystalline silicon thin film having a peak observed in a range of 516 $cm^{-1}$ or more and 518 $cm^{-1}$ or less in the Raman band will be described with reference to FIG. 15.

Figure 15:
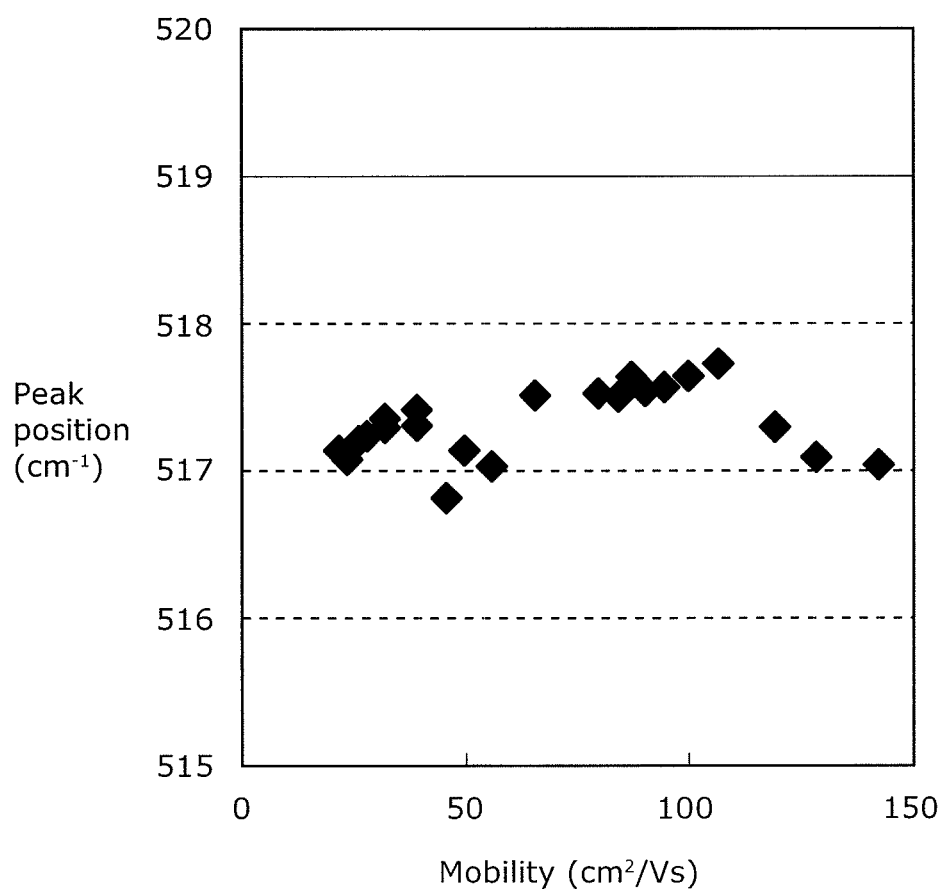
FIG. 15 is a diagram showing a relationship between the mobility of crystalline silicon thin films formed by the manufacturing method according to Embodiment 1 and the peak position of the crystalline silicon thin films.

FIG. 15 is a diagram showing a relationship between the mobility of crystalline silicon thin films formed by the manufacturing method according to the present embodiment and the peak position of the crystalline silicon thin films. In the diagram, the vertical axis indicates peak position ($cm^{-1}$), and the horizontal axis indicates the mobility ($cm^2/VS$) of the crystalline silicon thin films.

As shown in FIG. 15, it can be seen that crystalline silicon thin films whose peaks are observed in a range of 516 $cm^{-1}$ to 518 $cm^{-1}$ in the Raman band have a high mobility of 150 $cm^2/VS$ or less.

Next is a description of a preferred film quality condition for the crystalline silicon thin film 104 by using a peak position or peak value (peak intensity) in the Raman band of the crystalline silicon thin film.

Figure 16:
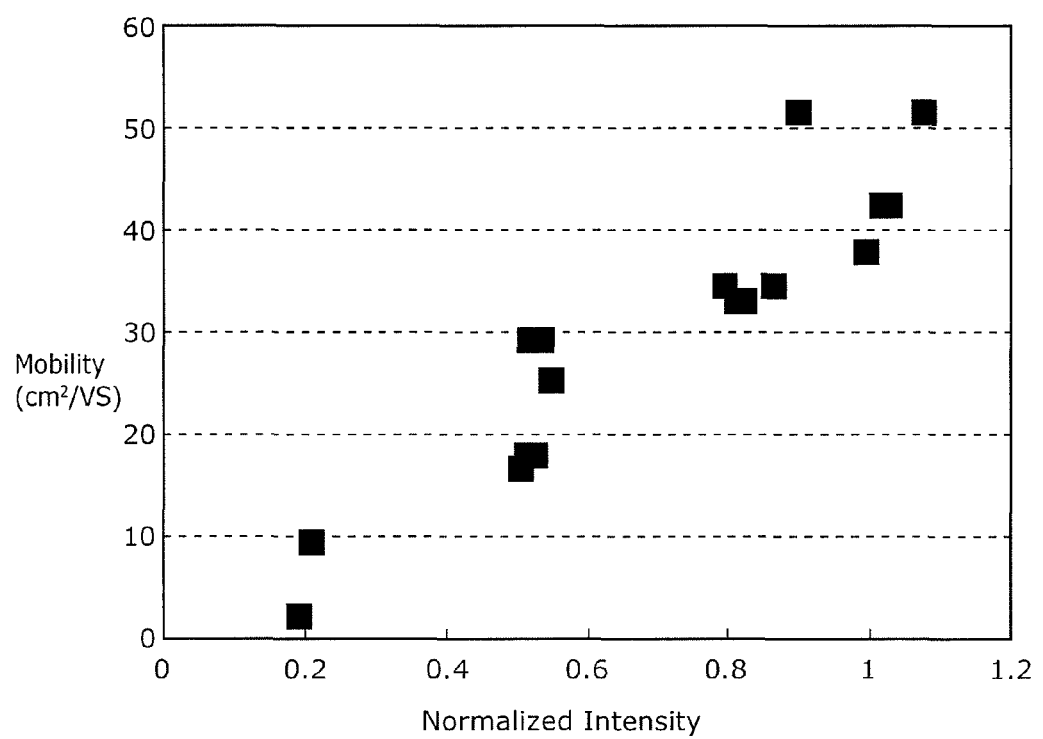
FIG. 16 is a diagram showing a relationship between the mobility of crystalline silicon thin films formed by the manufacturing method according to Embodiment 1 and the normalized peak intensity of the crystalline silicon thin films.

FIG. 16 is a diagram showing a relationship between the mobility of crystalline silicon thin films formed by the manufacturing method according to the present embodiment and the normalized peak intensity of the crystalline silicon thin films. In the diagram, the vertical axis indicates the mobility ($cm^2/VS$) of the polycrystalline silicon thin films, and the horizontal axis indicates the peak intensity normalized by the peak intensity of the crystalline silicon thin film at a mobility of 40 $cm^2/VS$.

As shown in FIG. 16, it can be seen that, in the range in which the mobility ranges from 20 $cm^2/VS$ to 50 $cm^2/VS$, the normalized peak intensity of the crystalline silicon thin film ranges from 0.5 to 1.2.

Accordingly, it can be seen that, as a preferred film quality condition, when the normalized peak intensity of the crystalline silicon thin film satisfies a range of 0.5 or more and 1.2 or less, the crystalline silicon thin film has high mobility characteristics with little variability in mobility.

Figure 17:
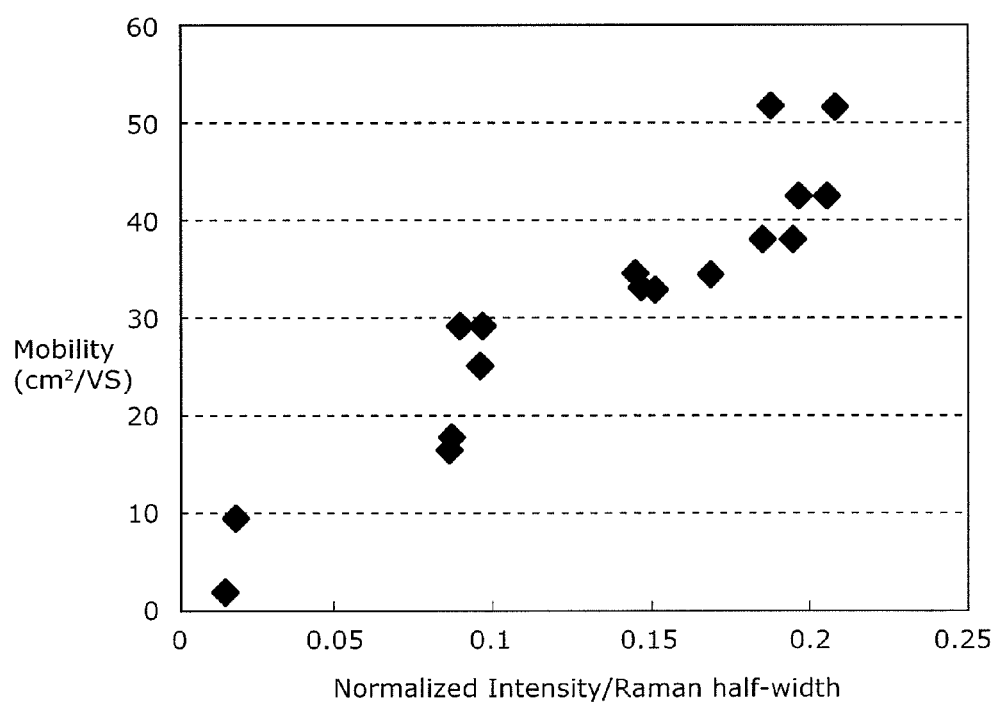
FIG. 17 is a diagram showing a relationship between the mobility of crystalline silicon thin films formed by the manufacturing method according to Embodiment 1 and the ratio of the normalized peak intensity with respect to the Raman half-width of the crystalline silicon thin films.

FIG. 17 is a diagram showing a relationship between the mobility of crystalline silicon thin films formed by the manufacturing method according to the present embodiment and the ratio of the normalized peak intensity to the Raman half-width of the crystalline silicon thin films. In the diagram, the vertical axis indicates the mobility ($cm^2/VS$) of the crystalline silicon thin films, and the horizontal axis indicates the Raman half-width normalized by the peak intensity of the crystalline silicon thin films at a mobility of 40 $cm^2/VS$.

As shown in FIG. 17, in the range in which the mobility ranges from 20 $cm^2/VS$ to 50 $cm^2/VS$, the normalized Raman half-width of the crystalline silicon thin film ranges from 0.1 to 0.2.

Accordingly, as a preferred film quality condition, when the ratio of the normalized peak intensity with respect to the Raman half-width of the crystalline silicon thin film satisfies a range of 0.1 to 0.2, the crystalline silicon thin film has high mobility characteristics with little variability in mobility.

As described above, according to the present embodiment, a thin-film transistor device is configured by using a crystalline silicon thin film 104 that satisfies a preferred film quality condition as a channel layer. It is thereby possible to achieve a thin-film transistor device in which a high-mobility crystalline silicon thin film whose mobility varies little is used as a channel layer.

In the foregoing description, in the thin-film transistor device of the present embodiment, a channel protection layer is formed on the non-crystalline silicon thin film, but the present disclosure is not limited thereto. It is also possible to form a channel protection layer on the crystalline silicon thin film, and form an amorphous silicon thin film on the channel protection layer. This will be described below as a variation.

(Variation)

Figure 18:
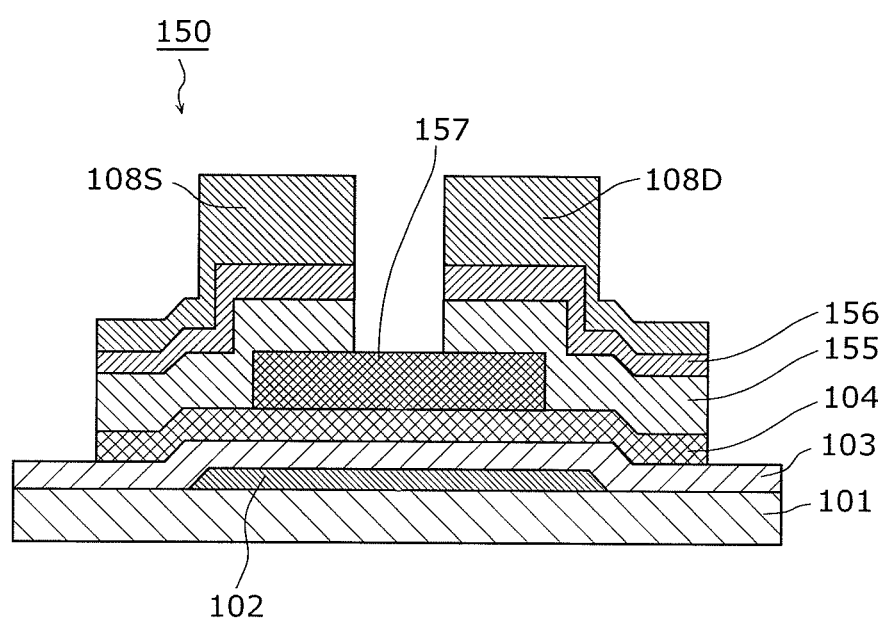
FIG. 18 is a cross-sectional view schematically showing a configuration of a thin-film transistor device according to a variation of Embodiment 1.

FIG. 18 is a cross-sectional view schematically showing a configuration of a thin-film transistor device according to a variation of the present embodiment. The structural elements that are the same as those shown in FIG. 1 are given the same reference numerals, and a description thereof is omitted here.

A thin-film transistor device 150 shown in FIG. 18 is different from the thin-film transistor device 100 of the present embodiment in terms of an amorphous silicon thin film 155 and an insulating layer 157 having different configurations from those of the thin-film transistor device 100.

The insulating layer 157 is, for example, an example of a channel protection layer, and protects a channel layer (crystalline silicon thin film 104). The insulating layer 157 functions as a channel etching stopper (CES) layer for preventing the amorphous silicon thin film 155 from being etched when a pair of amorphous silicon thin films 155 and a pair of contact layers 156 are formed. The insulating layer 157 is formed on the crystalline silicon thin film 104 including a channel region. The material and the like of the insulating layer 157 are the same as those of the insulating layer 107, and thus a description thereof is omitted here.

The pair of amorphous silicon thin films 155 is, for example, an example of a semiconductor film, for example, and is formed above the crystalline silicon thin film 104 including a channel region and the insulating layer 157. The pair of amorphous silicon thin films 155 face each other with a predetermined interval interposed therebetween on the insulating layer 157. Each of the pair of amorphous silicon thin films 155 is formed so as to extend from the upper surface of the insulating layer 157 to the crystalline silicon thin film 104. In the present variation, one of the pair of amorphous silicon thin films 155 is formed so as to extend from one end of the insulating layer 157 to the crystalline silicon thin film 104, and is formed so as to cover the top and the side of the insulating layer 157 at the one end thereof, as well as the upper surface of the crystalline silicon thin film 104 in a lateral region extending from the one end of the insulating layer 157. The other one of the pair of amorphous silicon thin films 155 is formed so as to extend from the other end of the insulating layer 157 to the crystalline silicon thin film 104, and is formed so as to cover the top and the side of the insulating layer 157 at the other end thereof, as well as the upper surface of the crystalline silicon thin film 104 in a lateral region extending from the other end of the insulating layer 157. The materials and the like of the pair of amorphous silicon thin films 155 are the same as those of the amorphous silicon thin film 105, and thus a description thereof is omitted here.

The pair of contact layers 156 face each other with a predetermined interval interposed therebetween on the insulating layer 157. The pair of contact layers 156 are respectively formed on the amorphous silicon thin films 155. The material and the like of the pair of contact layers 156 are the same as those of the contact layer 106, and thus a description thereof is omitted here.

The thin-film transistor device 150 is manufactured in the manner described above.

Next, a method for manufacturing a thin-film transistor device 150 having the above-described configuration will be described. FIGS. 19A to 19K are cross-sectional views schematically showing the steps of a method for manufacturing a thin-film transistor device according to the variation of the present embodiment.

FIGS. 19A to 19D are the same steps as those shown in FIGS. 2A to 2D, and thus a description thereof is omitted here.

Figure 19A:
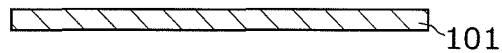
FIG. 19A is a cross-sectional view schematically showing a substrate preparation step of a method for manufacturing a thin-film transistor device according to the variation of Embodiment 1.
Figure 19B:
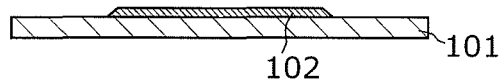
FIG. 19B is a cross-sectional view schematically showing a gate electrode forming step of the method for manufacturing a thin-film transistor device according to the variation of Embodiment 1.
Figure 19C:
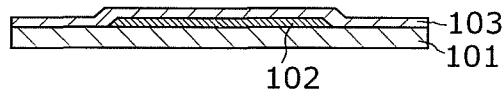
FIG. 19C is a cross-sectional view schematically showing a gate insulating film forming step of the method for manufacturing a thin-film transistor device according to the variation of Embodiment 1.
Figure 19D:
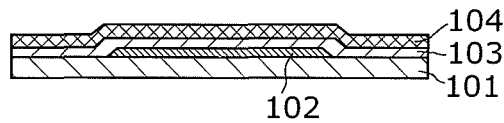
FIG. 19D is a cross-sectional view schematically showing a crystalline silicon layer forming step of the method for manufacturing a thin-film transistor device according to the variation of Embodiment 1.
Figure 19E:
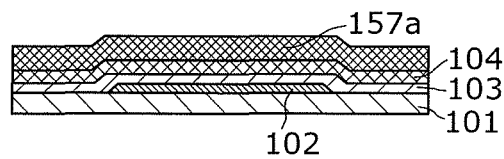
FIG. 19E is a cross-sectional view schematically showing an insulating layer forming film forming step of the method for manufacturing a thin-film transistor device according to the variation of Embodiment 1.

Next, as shown in FIG. 19E, an insulating layer forming film 157a for forming an insulating layer 157 is formed on the crystalline silicon thin film 104. The insulating layer forming film 157a is formed by using an inorganic material. It is assumed here that the insulating layer forming film 157a is formed by using, for example, an inorganic material such as silicon oxide.

Figure 19F:
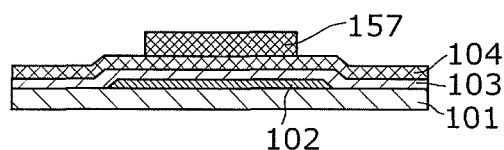
FIG. 19F is a cross-sectional view schematically showing an insulating layer forming step of the method for manufacturing a thin-film transistor device according to the variation of Embodiment 1.

Next, as a photomask for defining an insulating layer 157 having a predetermined shape, a resist layer having a predetermined width is formed on the insulating layer forming film 157a. After that, dry etching is performed using the resist layer as a mask so as to perform patterning on the insulating layer forming film 157a, and thereby an insulating layer 157 having a predetermined shape is formed. Subsequently, the resist layer formed on the insulating layer 157 is removed. Through this step, the upper surface of the insulating layer 157 is exposed as shown in FIG. 19F.

Figure 19G:
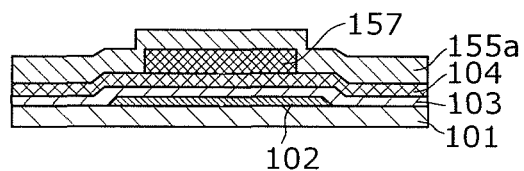
FIG. 19G is a cross-sectional view schematically showing an amorphous silicon layer forming step of the method for manufacturing a thin-film transistor device according to the variation of Embodiment 1.

Next, as shown in FIG. 19G, an amorphous silicon thin film 155 is formed on the insulating layer 157 and the crystalline silicon thin film 104. To be specific, after the insulating layer 157 has been formed, an amorphous silicon thin film 155 made of an amorphous silicon film is formed under a predetermined film-forming condition (formation condition) by using plasma CVD or the like.

Figure 19H:
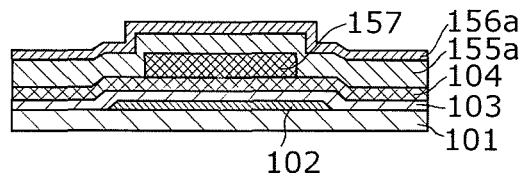
FIG. 19H is a cross-sectional view schematically showing a contact layer forming film forming step of the method for manufacturing a thin-film transistor device according to the variation of Embodiment 1.

Next, as shown in FIG. 19H, a contact layer forming film 156a for forming a contact layer 156 is formed on the amorphous silicon thin film 155. To be specific, a contact layer forming film 156a made of amorphous silicon doped with an impurity made of a pentavalent element such as phosphorus is formed on the amorphous silicon thin film 155 by, for example, plasma CVD.

The contact layer forming film 156a may be composed of two layers including a low-concentration electric field alleviating layer, and a high concentration contact layer. The low-concentration electric field alleviating layer can be formed by doing with phosphorus at a concentration of about $1 \times 10^{17}$ [atm/cm$^3$]. The two layers can be formed continuously by using a CVD apparatus.

Figure 19I:
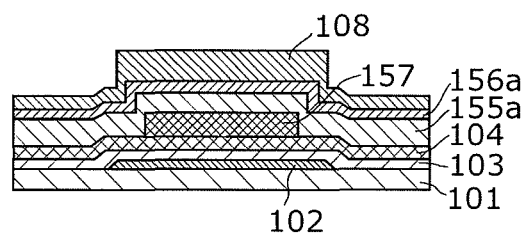
FIG. 19I is a cross-sectional view schematically showing a source drain metal film forming step of the method for manufacturing a thin-film transistor device according to the variation of Embodiment 1.

Next, as shown in FIG. 19I, a source drain metal film 108 for forming a source electrode 108S and a drain electrode 108D is formed so as to cover the contact layer forming film 156a. For example, a source drain metal film 108 having a three-layer structure of MoW, Al, and MoW is formed by sputtering.

After that, although not shown, in order to form a source electrode 108S and a drain electrode 108D having a predetermined shape, a resist material is applied onto the source drain metal film 108, which is then exposed to light and developed so as to form a resist layer patterned in a predetermined shape.

Figure 19J:
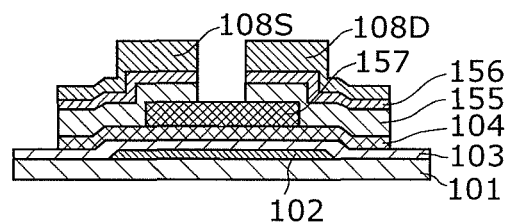
FIG. 19J is a cross-sectional view schematically showing a source electrode/drain electrode forming step of the method for manufacturing a thin-film transistor device according to the variation of Embodiment 1.

Next, as shown in FIG. 19J, wet etching is performed by using the resist layer as a mask so as to perform patterning on the source drain metal film 108, and thereby a source electrode 108S and a drain electrode 108D having a predetermined shape are formed. At this time, the contact layer forming film 106a functions as an etching stopper. After that, the resist layer formed on the source electrode 108S and the drain electrode 108D is removed. Subsequently, dry etching is performed by using the source electrode 108S and the drain electrode 108D as a mask so as to perform patterning on the contact layer forming film 156a and the amorphous silicon thin film 155, and thereby a pair of contact layers 156 having a predetermined shape and a pair of amorphous silicon thin films 155 having a predetermined shape are formed. As a condition for dry etching, a chlorine-based gas can be used.

In this way, the thin-film transistor device 150 according to the present embodiment can be manufactured.

Figure 19K:
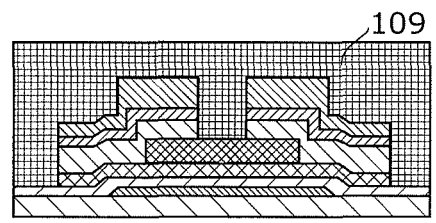
FIG. 19K is a cross-sectional view schematically showing a passivation film forming step of the method for manufacturing a thin-film transistor device according to the variation of Embodiment 1.

After that, as shown in FIG. 19K, it is also possible to form a passivation film 109 made of an inorganic material such as SiN so as to entirely cover the source electrode 108S and the drain electrode 108D.

In the manner described above, a thin-film transistor device is configured by using a crystalline silicon thin film 104 that satisfies a preferable film quality condition as a channel layer. It is thereby possible to achieve a thin-film transistor device in which a high-mobility crystalline silicon thin film whose mobility varies little is used as a channel layer.

Note that the thin-film transistor device of the present embodiment is applicable not only to an organic EL display apparatus including organic EL elements, but also to other display apparatuses including an active matrix substrate such as a liquid crystal display apparatus. Also, a display apparatus thus configured can be used as a flat panel display, and is applicable to various electronic appliances including a display panel such as television sets, personal computers, and mobile phones.

The thin-film transistor device according to the present disclosure and the method for manufacturing a thin-film transistor device according to the present disclosure have been described by way of an embodiment and a variation thereof, but the thin-film transistor device and the manufacturing method thereof of the present disclosure are not limited to the above-described embodiment and variation.

For example, the above embodiment has been described using a channel protected thin-film transistor device including an insulating layer (channel protection film), but the present disclosure is not limited thereto. The present disclosure is also applicable to a channel etched thin-film transistor device that does not include an insulating layer (channel protection film).

The present disclosure also encompasses other embodiments obtained by making various types of modifications that can be conceived by those skilled in the art to the above embodiment and variation, as well as embodiments implemented by arbitrarily combining the structural elements and functions of the above embodiment and variation without departing from the spirit and scope of the present disclosure.

Embodiment 2

In Embodiment 2, a polycrystalline silicon substrate, a method for manufacturing a polycrystalline silicon substrate, and an electronic device including a polycrystalline silicon substrate will be described.

It should be understood that the film quality evaluation method of a silicon substrate and the characteristics of a crystalline silicon thin film described in Embodiment 1 are all included in the present embodiment, and hereinafter, parts that are not described in Embodiment 1 will be described. Also, the present embodiment will be described by using a polycrystalline silicon thin film as the crystalline silicon thin film 104 of Embodiment 1.

Figure 20:
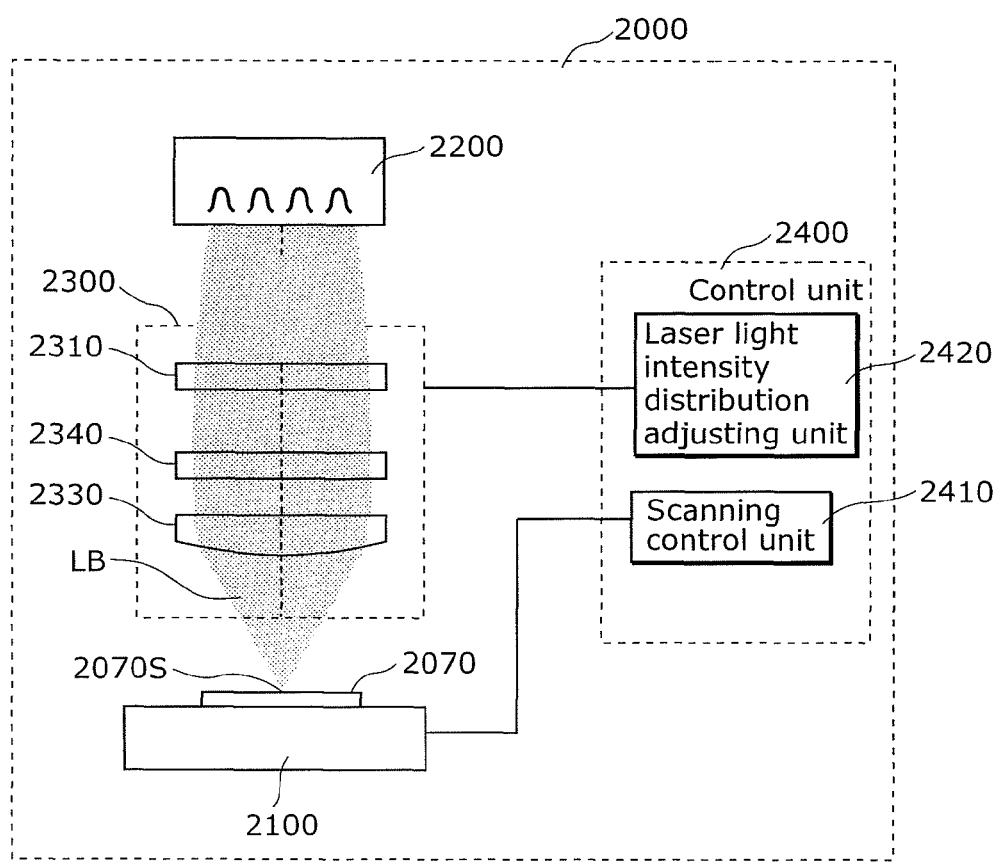
FIG. 20 is a diagram showing a configuration of a polycrystalline silicon thin film forming apparatus according to Embodiment 2.

FIG. 20 is a diagram showing a configuration of a polycrystalline silicon thin film forming apparatus 2000 according to the present embodiment.

The polycrystalline silicon thin film forming apparatus 2000 of the present embodiment is an apparatus for crystallizing an amorphous silicon thin film made of amorphous silicon into a polycrystalline silicon thin film by shaping laser light LB having a predetermined light intensity distribution.

In FIG. 20, at least one of laser light LB and a sample 2070 (a substrate 101 on which an amorphous silicon thin film has been formed) is moved so as to perform relative scanning using the laser light LB on the amorphous silicon thin film. In the present embodiment, the sample 2070 (the substrate 101 on which an amorphous silicon thin film has been formed) was scanned with the laser light LB being fixed. It is desirable that the laser used in the present embodiment is a continuous wave laser (CW laser). The CW laser continuously emits laser light, and thus enables processing at a higher speed than a pulse laser. Also, the CW laser has a scan speed higher than a pulse laser by one order of magnitude or more, and thus throughput can be easily improved.

As shown in FIG. 20, the polycrystalline silicon thin film forming apparatus 2000 is an apparatus for crystallizing an amorphous silicon thin film by using CW laser light, and includes a sample holding unit 2100, a laser light emitting unit 2200, an optical system unit 2300, and a control unit 2400 including a scanning control unit 2410 and a laser light intensity distribution adjusting unit 2420.

The sample holding unit 2100 is a stage for holding the sample 2070 on which an amorphous silicon thin film has been formed, the sample 2070 being a target to be crystallized. For example, as an amorphous silicon thin film, an amorphous silicon film (non-crystalline silicon film) is formed on a surface 2070S of the sample 2070, the surface 2070S being a surface that is to be irradiated with laser light LB. In the present embodiment, in the sample 2070, a gate insulating film 103 is formed on the substrate 101, and the amorphous silicon thin film is formed on the surface of the gate insulating film 103.

The laser light emitting unit 2200 is a laser light source that emits laser light LB for crystallizing the amorphous silicon thin film. The laser light emitting unit 2200 of the present embodiment is provided with a semiconductor laser apparatus. As the semiconductor laser apparatus, it is possible to use, for example, an apparatus that can continuously emit green laser light having a wavelength range of, for example, 495 nm or more and 590 nm or less in the order of microseconds such as 10 µsec or more and 100 µsec or less.

The optical system unit 2300 is composed of a plurality of beam shaping lenses, and is configured to shape the laser light LB emitted from the laser light emitting unit 2200 into laser light LB having a predetermined light intensity distribution, and apply the laser light LB onto a predetermined region of the amorphous silicon thin film (the surface 2070S of the sample 2070). In the present embodiment, the optical system unit 2300 includes a homogenizer 2310, a condenser lens 2320, and a diffractive optical element (DOE) lens 2330. As the beam shaping lenses, a lens for shaping a beam profile in the major axis direction and a lens for shaping a beam profile in the minor axis direction may be provided separately.

In the control unit 2400, the scanning control unit 2410 controls the sample holding unit 2100 or the optical system unit 2300 such that the laser light LB applied to the amorphous silicon thin film is beam scanned relative to the amorphous silicon thin film. The scanning control unit 2410 of the present embodiment performs control so as to move the sample holding unit 2100 to a predetermined position, and thereby the sample 2070 is moved.

Also, the laser light intensity distribution adjusting unit 2420 shapes the laser light LB so as to have a predetermined intensity distribution. The laser light intensity distribution adjusting unit 2420 of the present embodiment shapes the laser light LB emitted from the laser light emitting unit 2200 by adjusting the lenses constituting the optical system unit 2300 so as to obtain laser light LB having a predetermined light intensity distribution.

The polycrystalline silicon thin film forming apparatus 2000 may further include optical components such as a mirror and a condensing lens, and a beam profiler for measuring a beam profile of laser light. By measuring a beam profile by using the beam profiler, based on the result of measurement, the positions of the lenses of the optical system unit 2300 can be adjusted by the laser light intensity distribution adjusting unit 2420 such that the laser light applied to the amorphous silicon thin film has a desired light intensity distribution.

Next, a preferred film quality condition (a value indicating preferred crystallinity) of the crystalline silicon thin film 104 of the thin-film transistor device 100 according to the present embodiment will be described.

As in Embodiment 1, FIG. 6 is a diagram also showing a relationship between the mobility of polycrystalline silicon thin films formed by the manufacturing method according to the present embodiment and the Raman half-width of the polycrystalline silicon thin films. Data points shown in FIG. 6 are respectively obtained from a plurality of samples 2070 in which a polycrystalline silicon thin film is formed on the gate electrode by the above-described manufacturing method. In the diagram, the vertical axis indicates mobility ($cm^2$/VS), and the horizontal axis indicates the Raman half-width, specifically, the Raman half-width ($cm^{-1}$) observed in a range of 516 $cm^{-1}$ or more and 518 $cm^{-1}$ or less. FIG. 7 shows the variability in the absolute value of mobility shown in FIG. 6. That is, FIG. 7 is a diagram showing a relationship between the variability in the absolute value of mobility (FIG. 6) of polycrystalline silicon thin films formed by the manufacturing method according to the present embodiment and the Raman half-width of the polycrystalline silicon thin films. In the diagram, the vertical axis indicates the variability (%) in the mobility of the polycrystalline silicon thin films ($3\sigma$/average value×100), and the horizontal axis indicates the Raman half-width ($cm^{-1}$) of the polycrystalline silicon thin films.

As shown in FIG. 7, it can be seen that the range in which the mobility varies little is a range F2 in which the Raman half-width ranges from 5.2 $cm^{-1}$ to 5.8 $cm^{-1}$.

Also, in FIG. 6, it can be seen that the range in which the mobility varies relatively little is a range F1 in which the mobility ranges from 20 $cm^2$/VS to 50 $cm^2$/VS. That is, it can be seen that in the range F1 in which the Raman half-width ranges from 5.2 $cm^{-1}$ to 5.8 $cm^{-1}$, the mobility ranges from 20 $cm^2$/VS to 50 $cm^2$/VS.

Accordingly, it is predicted that, as a preferred film quality condition, when the polycrystalline silicon thin film satisfies a range of 5.0 $cm^{-1}$ or more and 6.0 $cm^{-1}$ or less as the Raman half-width thereof, the polycrystalline silicon thin film has high mobility characteristics with little variability in mobility. From FIG. 7, it is more preferable that the Raman half-width is 5.0 $cm^{-1}$ or more and less than 6.0 $cm^{-1}$.

From the above, it can be seen that, as a preferred film quality condition, when the Raman half-width of the polycrystalline silicon thin film satisfies a range of 5.2 $cm^{-1}$ or more and 5.8 $cm^{-1}$ or less, the polycrystalline silicon thin film has high mobility characteristics with little variability in mobility.

This is presumably because when the Raman half-width is smaller than 5 $cm^{-1}$, the grain size of the polycrystalline silicon thin film increases (large grain size), and the variability in mobility increases. On the other hand, when the Raman half-width is 6 $cm^{-1}$ or less, although the grain size of the polycrystalline silicon thin film is small, the variability in mobility increases as a result of an explosive crystalline state (a mixed crystal of a microcrystalline structure and a partially melt structure) being mixed.

FIG. 9 is a diagram also showing a relationship between the Raman half-width of polycrystalline silicon thin films formed by the manufacturing method according to the present embodiment and the energy density of green laser light applied to form the polycrystalline silicon thin films. In the diagram, the vertical axis indicates the Raman half-width ($cm^{-1}$) of the polycrystalline silicon thin films, and the horizontal axis indicates the energy density ($mJ/cm^2$) of green laser light applied to from the polycrystalline silicon thin films.

As shown in FIG. 9, in the range in which the Raman half-width ranges from 5.2 $cm^{-1}$ to 5.8 $cm^{-1}$, the energy density ($mJ/cm^2$) of green laser light applied to form the polycrystalline silicon thin film ranges from 6.8 $mJ/cm^2$ to 9 $mJ/cm^2$.

That is, it can be seen that there is a process margin for the energy density ($mJ/cm^2$) of green laser light for forming the polycrystalline silicon thin film having a Raman half-width that satisfies a range of 5.2 $cm^{-1}$ or more and 5.8 $cm^{-1}$ or less.

FIG. 10 is a diagram also showing a relationship between the Raman half-width of polycrystalline silicon thin films formed by the manufacturing method according to the present embodiment and the crystal grain size of the polycrystalline silicon thin films. In the diagram, the vertical axis indicates the Raman half-width ($cm^{-1}$) of the polycrystalline silicon thin films, and the horizontal axis indicates the crystal grain size (nm) of the polycrystalline silicon thin films. FIG. 11 is a micrograph obtained by a scanning electron microscope (SEM) also showing a crystal structure of the polycrystalline silicon thin film having a Raman half-width of 5.2 $cm^{-1}$ or more and 5.8 $cm^{-1}$ or less.

As shown in FIG. 10, in the range in which the Raman half-width ranges from 5.2 $cm^{-1}$ to 5.8 $cm^{-1}$, the crystal grain size of the polycrystalline silicon thin film ranges from 30 nm to 300 nm.

That is, as a preferred film quality condition, when the Raman half-width of the polycrystalline silicon thin film satisfies a range of 5.2 $cm^{-1}$ or more and 5.8 $cm^{-1}$ or less, the grain size of the polycrystalline silicon thin film ranges from 30 nm to 300 nm as shown in FIG. 11.

FIG. 12 is a diagram also showing a relationship between the Raman half-width ratio of polycrystalline silicon thin films formed by the manufacturing method according to the present embodiment and the crystal grain size of the polycrystalline silicon thin films. In the diagram, the vertical axis indicates the Raman half-width ratio of the polycrystalline silicon thin films, or in other words, the ratio of the Raman half-width of the crystalline silicon thin film 104 with respect to the Raman half-width of monocrystalline silicon. The horizontal axis indicates the crystal grain size (nm) of the polycrystalline silicon thin films.

Figure 21:
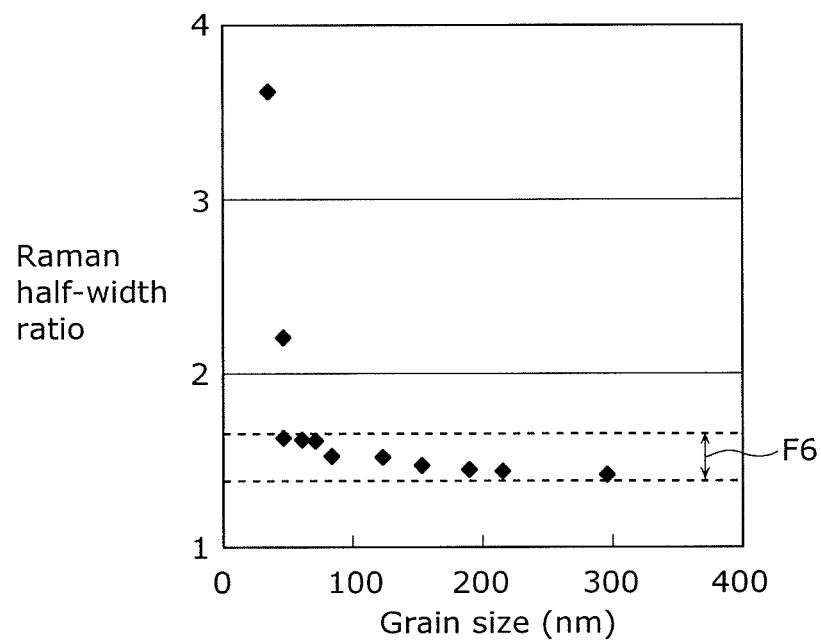
FIG. 21 is a diagram showing a relationship between the Raman half-width ratio of polycrystalline silicon thin films formed by a manufacturing method according to Embodiment 2 and the crystal grain size of the polycrystalline silicon thin films.

As shown in FIG. 21, in a range F6 in which the Raman half-width ratio ranges from 1.4 to 1.7, the crystal grain size of the polycrystalline silicon thin film ranges from 30 nm to 300 nm.

From the above, it can be seen that, as a preferred film quality condition, when the Raman half-width ratio of the polycrystalline silicon thin film satisfies a range of 1.4 or more and 1.7 or less, the grain size of the polycrystalline silicon thin film ranges from 30 nm to 300 nm as shown in FIG. 11.

Figure 22:
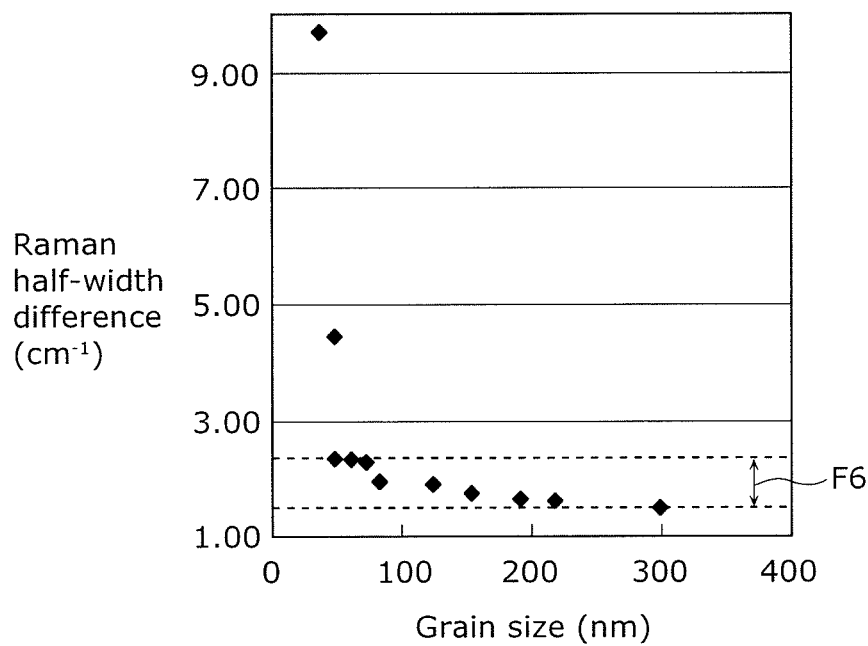
FIG. 22 is a diagram showing a relationship between the Raman half-width difference of polycrystalline silicon thin films formed by the manufacturing method according to Embodiment 2 and the crystal grain size of the polycrystalline silicon thin films.

FIG. 22 is a diagram showing a relationship between the Raman half-width difference of polycrystalline silicon thin films formed by the manufacturing method according to the present embodiment and the crystal grain size of the polycrystalline silicon thin films. In the diagram, the vertical axis indicates the Raman half-width difference ($cm^{-1}$) of the polycrystalline silicon thin films, or in other words, the difference ($cm^{-1}$) between the Raman half-width of the crystalline silicon thin film 104 and the Raman half-width of a monocrystalline silicon substrate. The horizontal axis indicates the crystal grain size (nm) of the polycrystalline silicon thin films.

As shown in FIG. 22, in a range F6 in which the Raman half-width difference of the polycrystalline silicon thin film ranges from 1.5 cm$^{-1}$ to 2.3 cm$^{-1}$, the crystal grain size of the polycrystalline silicon thin film ranges from 30 nm to 300 nm.

It can be seen from the above that, as a preferred film quality condition, when the Raman half-width difference of the polycrystalline silicon thin film satisfies a range of 1.5 cm$^{-1}$ or more and 2.3 cm$^{-1}$ or less, the grain size of the polycrystalline silicon thin film ranges from 30 nm to 300 nm as shown in FIG. 11.

Figure 23:
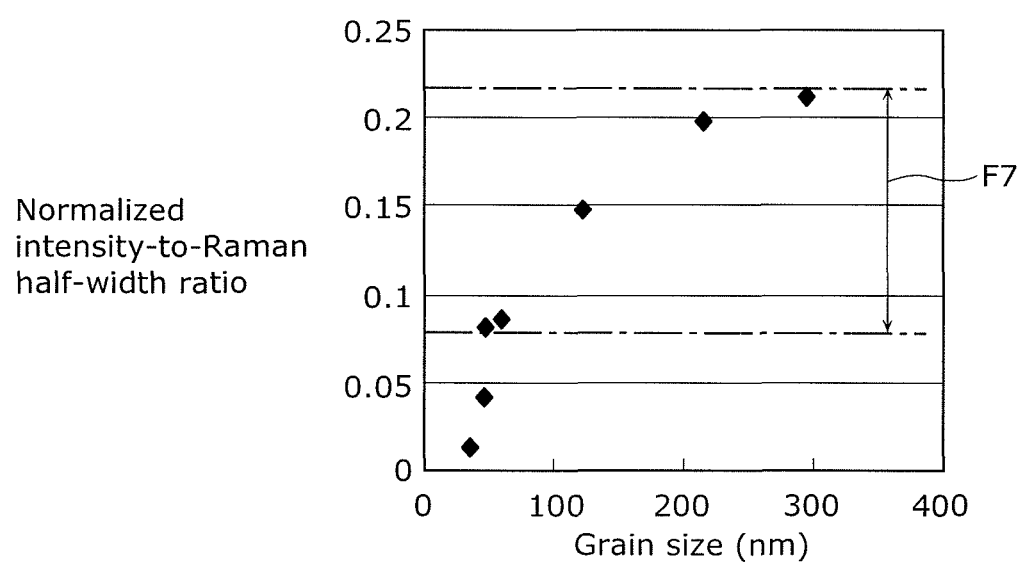
FIG. 23 is a diagram showing a relationship between the normalized intensity-to-Raman half-width ratio of polycrystalline silicon thin films formed by the manufacturing method according to Embodiment 2 and the crystal grain size of the polycrystalline silicon thin films.

FIG. 23 is a diagram showing a relationship between the normalized intensity-to-Raman half-width ratio of polycrystalline silicon thin films formed by the manufacturing method according to the present embodiment and the crystal grain size of the polycrystalline silicon thin films. In the diagram, the vertical axis indicates the normalized intensity-to-Raman half-width ratio of the polycrystalline silicon thin films, or in other words, the ratio of normalized intensity in the Raman band of the crystalline silicon thin film 104 with respect to the Raman half-width of the crystalline silicon thin film 104. The normalized peak intensity is a peak value in the Raman band of the crystalline silicon thin film 104 having a grain size of 150 nm. The horizontal axis indicates the crystal grain size (nm) of the polycrystalline silicon thin films.

As shown in FIG. 23, it can be seen that, in a range F7 in which the normalized intensity-to-Raman half-width ratio of the polycrystalline silicon thin films satisfies a range of 0.08 or more and 0.22 or less, the crystal grain size of the polycrystalline silicon thin films range from 30 nm to 300 nm.

It can be seen from the above that, as a preferred film quality condition, when the normalized intensity-to-Raman half-width ratio of the polycrystalline silicon thin film satisfies a range of 0.08 or more and 0.22 or less, the grain size of the polycrystalline silicon thin film ranges from 30 nm to 300 nm as shown in FIG. 11.

Next is a description of the surface roughness of the crystalline silicon thin film 104 when the crystalline silicon thin film 104 of the thin-film transistor device 100 according to the present embodiment satisfies a preferred film quality condition (a value indicating preferred crystallinity).

Figure 24:
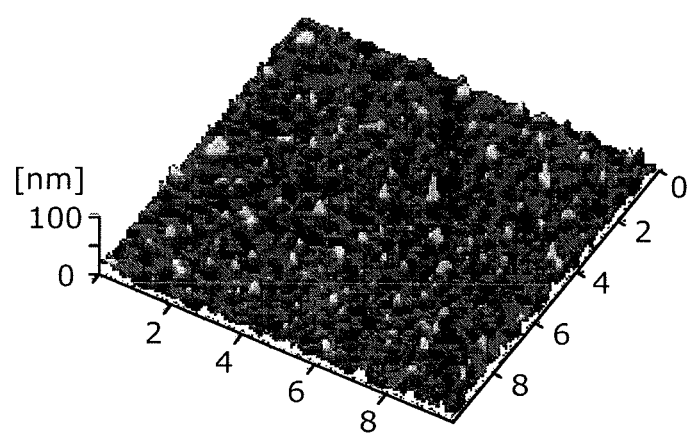
FIG. 24 is an example of a micrograph obtained by an atomic force microscope (AFM) showing irregularities on the surface of a polycrystalline silicon thin film formed by the manufacturing method according to Embodiment 2.

FIG. 24 is an example of a micrograph obtained by an atomic force microscope (AFM) showing irregularities on the surface of a polycrystalline silicon thin film formed by the manufacturing method according to the present embodiment.

The atomic force microscope (hereinafter referred to as AFM) is an apparatus for obtaining an image of fine irregularities on the surface of a sample by using a single-sided cantilever (hereinafter referred to as a cantilever) having a sharply pointed probe at the tip thereof, as a force detector.

Figure 25:
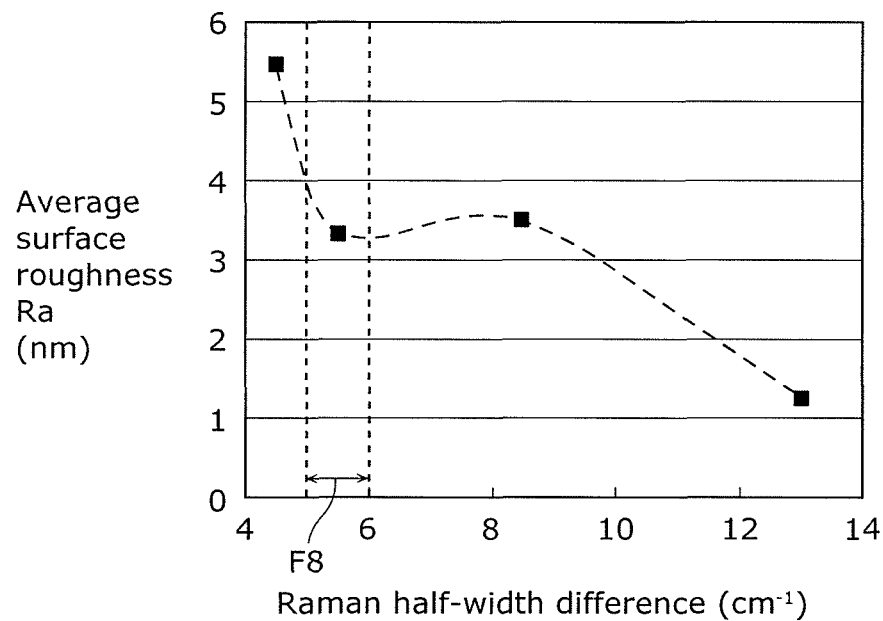
FIG. 25 is a diagram showing a relationship between the Raman half-width difference of polycrystalline silicon thin films formed by the manufacturing method according to Embodiment 2 and the average surface roughness (Ra) of the polycrystalline silicon thin films.

FIG. 25 is a diagram showing a relationship between the Raman half-width difference of polycrystalline silicon thin films formed by the manufacturing method according to the present embodiment and the average surface roughness (Ra) of the polycrystalline silicon thin films. In the diagram, the vertical axis indicates the average surface roughness Ra (nm) of the polycrystalline silicon thin films. The horizontal axis indicates the Raman half-width (cm$^{-1}$) of the polycrystalline silicon thin films. The average surface roughness Ra (nm) of the polycrystalline silicon thin films is calculated from AFM micrographs of the polycrystalline silicon thin films as shown in FIG. 24.

As shown in FIG. 25, it can be seen that, in a range F8 in which the polycrystalline silicon thin films satisfy a preferred film quality condition, or in other words, a Raman half-width of 5.2 cm$^{-1}$ or more and 5.8 cm$^{-1}$ or less, the average surface roughness Ra of the polycrystalline silicon thin films ranges from 3.2 nm to 4 nm.

That is, as a preferred film quality condition, when the Raman half-width of the polycrystalline silicon thin film satisfies a range of 5.2 cm$^{-1}$ or more and 5.8 cm$^{-1}$ or less, the crystallinity of the polycrystalline silicon thin film varies little, and the surface roughness is reduced.

Figure 26:
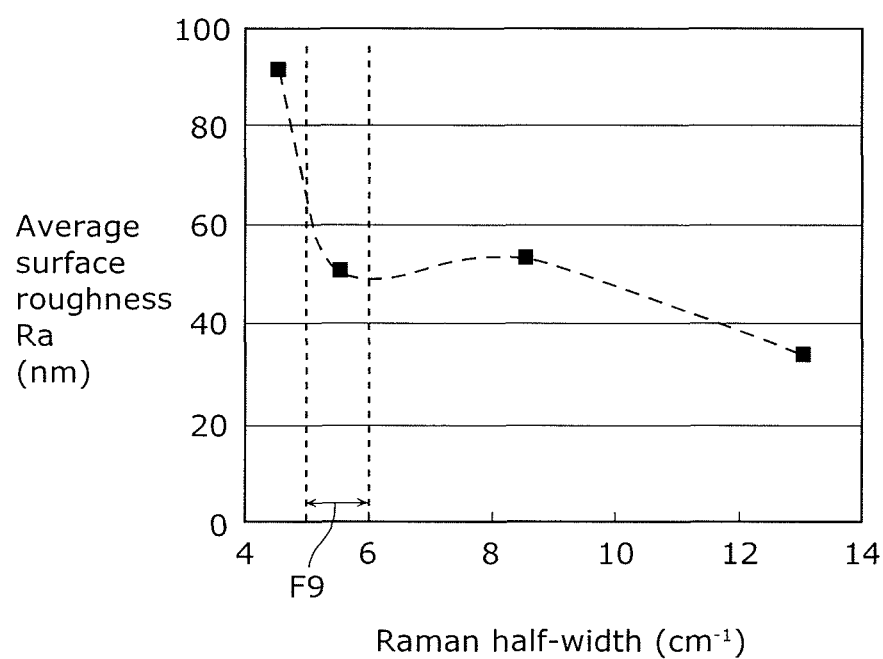
FIG. 26 is a diagram showing a relationship between the Raman half-width difference of polycrystalline silicon thin films formed by the manufacturing method according to Embodiment 2 and the maximum surface roughness (Rmax) of the polycrystalline silicon thin films.

FIG. 26 is a diagram showing a relationship between the Raman half-width difference of polycrystalline silicon thin films formed by the manufacturing method according to the present embodiment and the maximum surface roughness (Rmax) of the polycrystalline silicon thin films. In the diagram, the vertical axis indicates the maximum surface roughness Rmax (nm) of the polycrystalline silicon thin films. The horizontal axis indicates the Raman half-width (cm$^{-1}$) of the polycrystalline silicon thin films. The maximum surface roughness Rmax (nm) of the polycrystalline silicon thin films is calculated from AFM micrographs of the polycrystalline silicon thin films as shown in FIG. 24.

As shown in FIG. 26, it can be seen that, in a range F8 in which the polycrystalline silicon thin films satisfy a preferred film quality condition, or in other words, a Raman half-width of 5.2 cm$^{-1}$ or more and 5.8 cm$^{-1}$ or less, the maximum surface roughness Rmax of the polycrystalline silicon thin films falls within a specific range of 50 nm or more and 60 nm or less.

That is, it can be seen that, as a preferred film quality condition, when the Raman half-width of the polycrystalline silicon thin film satisfies a range of 5.2 cm$^{-1}$ or more and 5.8 cm$^{-1}$ or less, the crystallinity of the polycrystalline silicon thin film varies little, and the surface roughness is reduced.

The orientation direction of the polycrystalline silicon thin film is the same as that described in Embodiment 1 with reference to FIG. 12, and thus a description thereof is omitted here.

As described above, in the thin-film transistor device 100, the crystalline silicon thin film 104 that satisfies, as a preferred film quality condition, a Raman half-width corresponding to a phonon mode specific to the crystalline silicon thin film 104 of 5.0 cm$^{-1}$ or more and 6.0 cm$^{-1}$ or less is used as a channel layer. Furthermore, in the crystalline silicon thin film 104 that satisfies, as a preferred film quality condition, a Raman half-width of 5.0 cm$^{-1}$ or more and less than 6.0 cm$^{-1}$, its average crystal grain size is about 50 nm or more and 300 nm or less, and its crystals are predominantly oriented in the (100) direction, and not in the (111) direction. Also, the maximum surface roughness (Rmax) of the crystalline silicon thin film 104 is 50 nm or more and 60 nm or less (or the average surface roughness (Ra) thereof is 3.2 nm or more and 4 nm or less).

In the foregoing, a preferred film quality condition, or in other words, a value indicating preferred crystallinity of the polycrystalline silicon thin film whose crystallinity varies little is indicated by using the Raman half-width of the polycrystalline silicon thin film, but the present disclosure is not limited thereto. It is also possible to use the ratio of the Raman half-width of the polycrystalline silicon thin film with respect to the Raman half-width of monocrystalline silicon (c-Si).

FIG. 13 is a diagram also showing a relationship between the mobility of polycrystalline silicon thin films formed by the manufacturing method according to the present embodiment and the ratio of the Raman half-width of the crystalline silicon thin films with respect to the Raman half-width of monocrystalline silicon (c-Si). In the diagram, the vertical axis indicates mobility (cm$^2$/VS), and the horizontal axis indicates the ratio of the Raman half-width of the polycrystalline silicon thin film with respect to the Raman half-width of monocrystalline silicon (c-Si). Also, the Raman half-width of monocrystalline silicon (c-Si) is 3.4 cm$^{-1}$, and the Raman shift is the half width in the Raman band at around 520 cm$^{-1}$.

In FIG. 13, a range F4 is the range in which the mobility ranges from 20 cm$^2$/VS to 50 cm$^2$/VS. In the range F4, the ratio of the Raman half-width of the polycrystalline silicon thin film with respect to the Raman half-width of monocrystalline silicon (c-Si) is 1.4 or more and 1.7 or less.

Accordingly, as a preferred film quality condition, when the ratio of the Raman half-width of the polycrystalline silicon thin film with respect to the Raman half-width of monocrystalline silicon (c-Si) satisfies a range of 1.4 or more and 1.7 or less, the polycrystalline silicon thin film has crystallinity that varies little.

As described above, according to the present embodiment, a thin-film transistor device is formed by using a crystalline silicon thin film 104 that satisfies a preferred film quality condition as a channel layer. It is thereby possible to achieve a thin-film transistor device in which a polycrystalline silicon thin film whose crystallinity varies little is used as a channel layer.

In the thin-film transistor device of the present embodiment, the channel protection layer is formed on the non-crystalline silicon thin film, but the configuration is not limited thereto. It is also possible to form a channel protection layer on the crystalline silicon thin film, and form an amorphous silicon thin film on the channel protection layer.

Embodiment 3

In the foregoing, an example of a bottom-gate thin film transistor has been described as an example of an electronic device including a polycrystalline silicon thin film whose crystallinity varies little, but the present disclosure is not limited thereto. The electronic device including a polycrystalline silicon thin film whose crystallinity varies little may be a polycrystalline silicon substrate including a polycrystalline silicon thin film whose crystallinity varies little. This will be described below.

Figure 27:
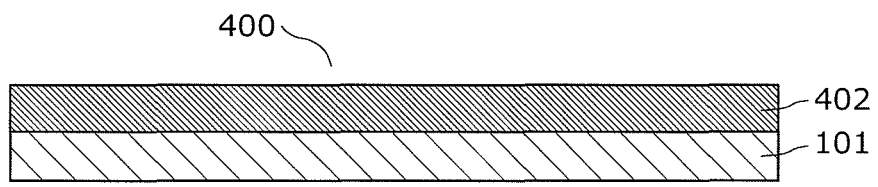
FIG. 27 is a cross-sectional view schematically showing a configuration of a polycrystalline silicon substrate according to Embodiment 3.

FIG. 27 is a cross-sectional view schematically showing a configuration of a polycrystalline silicon substrate 400 according to Embodiment 3. The structural elements that are the same as those shown in FIG. 1 are given the same reference numerals, and a description thereof is omitted here.

The polycrystalline silicon substrate 400 includes a substrate 101 and a polycrystalline silicon thin film 402.

The polycrystalline silicon thin film 402 is an example of a polycrystalline silicon thin film, and can be formed by, for example, crystallizing non-crystalline amorphous silicon (amorphous silicon).

The crystalline silicon in the polycrystalline silicon thin film 402 has an average crystal grain size of about 50 nm or more and 300 nm or less. The polycrystalline silicon thin film 402 has a thickness of, for example, about 20 or more and 100 nm or less. Also, the crystallinity of the polycrystalline silicon thin film 402 can be expressed as follows. To be specific, the half-width (hereinafter also referred to as "Raman half-width") of the Raman band corresponding to a phonon mode specific to the polycrystalline silicon thin film 402 is 5.0 cm$^{-1}$ or more and 6.0 cm$^{-1}$ or less. As used herein, the "phonon mode specific to the polycrystalline silicon thin film 402" refers to a transverse optical (TO) phonon mode.

It is more preferable that the range of 5.0 to cm$^{-1}$ or more and 6.0 cm$^{-1}$ or less is a range of 5.0 cm$^{-1}$ or more and less than 6.0 cm$^{-1}$.

The crystallinity of the polycrystalline silicon thin film 402 may be expressed in a different manner. For example, it is possible to use the ratio between the Raman half-width of the polycrystalline silicon thin film 402 and the Raman half-width of monocrystalline silicon that satisfies a range of 1.4 to 1.7. Alternatively, it is possible to use the difference between the Raman half-width of the polycrystalline silicon thin film 402 and the Raman half-width of a monocrystalline silicon substrate that satisfies a range of 1.5 cm$^{-1}$ or more and 2.3 cm$^{-1}$ or less. Furthermore, it is possible to use the (peak value-to-Raman half-width) ratio of the peak value in the Raman band of the polycrystalline silicon thin film with respect to the Raman half-width of the polycrystalline silicon thin film 402 that satisfies a range of 0.08 or more and 0.22 or less. The peak position in the Raman band of the polycrystalline silicon thin film 402 is observed at 516 cm$^{-1}$ or more and 518 cm$^{-1}$ or less, and the value of the Raman half-width of monocrystalline silicon (c-Si) is 3.4 cm$^{-1}$.

Also, the crystals of the polycrystalline silicon thin film 402 are predominantly oriented in the (100) direction, and not in the (111) direction. The polycrystalline silicon thin film has a maximum surface roughness (Rmax) of 50 nm or more and 60 nm or less, and the polycrystalline silicon thin film has an average surface roughness (Ra) of 3.2 nm or more and 4 nm or less, and thus the surface roughness is reduced.

The polycrystalline silicon substrate 400 is manufactured in the manner described above.

That is, the polycrystalline silicon thin film 402 has a half-width of the Raman band corresponding to a phonon mode specific thereto that satisfies a range of 5.0 cm$^{-1}$ or more and less than 6.0 cm$^{-1}$, and an average crystal grain size that satisfies a range of about 50 nm or more and 300 nm or less. Accordingly, in the polycrystalline silicon substrate 400, the polycrystalline silicon thin film has a maximum surface roughness (Rmax) of 50 nm or more and 60 nm or less (or an average surface roughness (Ra) of 3.2 nm or more and 4 nm or less). Thus, the polycrystalline silicon substrate 400 can include a polycrystalline silicon thin film whose crystallinity varies little.

As in Embodiment 1, the polycrystalline silicon substrate 400 is formed by using a polycrystalline silicon thin film 402 selected (chosen) during the manufacturing process thereof described later, the selected (chosen) polycrystalline silicon thin film 402 being a polycrystalline silicon thin film that satisfies at least a half-width of the Raman band corresponding to a phonon mode specific thereto of 5.0 cm$^{-1}$ or more and less than 6.0 cm$^{-1}$.

Next, a method for manufacturing a polycrystalline silicon substrate 400 according to the present embodiment will be described with reference to FIGS. 28A to 28D. FIGS. 28A to 28D are cross-sectional views schematically showing the steps of the method for manufacturing a polycrystalline silicon substrate 400 according to the present embodiment.

Figure 28A:
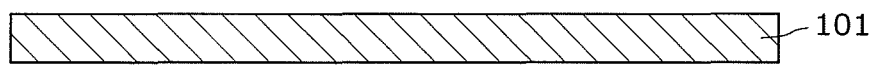
FIG. 28A is a cross-sectional view schematically showing a substrate preparation step of a method for manufacturing a polycrystalline silicon substrate according to Embodiment 3.

First, as shown in FIG. 28A, a substrate 101 is prepared (substrate preparation step). As the substrate 101, for example, a glass substrate can be used. The preparation of the substrate 101 may include, for example, a cleaning step of removing adherents and the like that have attached to the surface of the glass substrate, a glass substrate surface etching step of removing alkali metal components of the surface of the glass substrate, a step of forming an undercoat layer such as an SiN film on the surface of the glass substrate in order to prevent the alkali metal components contained in the glass substrate from being diffused to the semiconductor film, or the like.

Figure 28B:
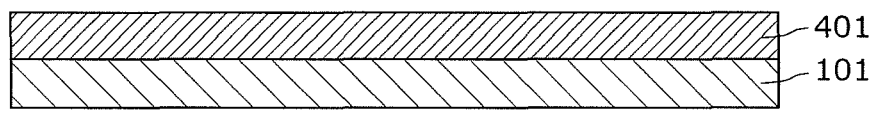
FIG. 28B is a cross-sectional view schematically showing a thin film forming step of the method for manufacturing a polycrystalline silicon substrate according to Embodiment 3.

Next, as shown in FIG. 28B, an amorphous silicon thin film 401 is formed above the substrate 101 (thin film forming step). For example, a non-crystalline silicon thin film 13 made of an amorphous silicon film is formed above the substrate 101.

Figure 28C:
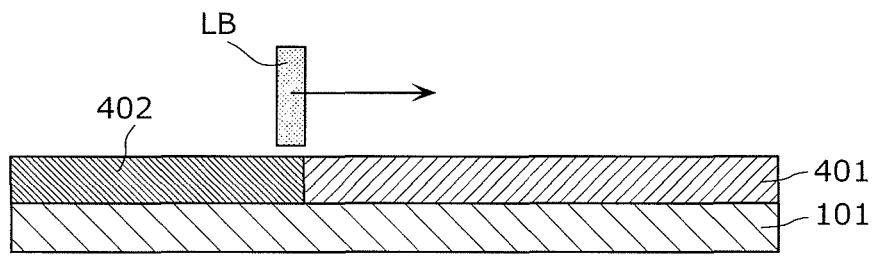
FIG. 28C is a cross-sectional view schematically showing a crystallization step of the method for manufacturing a polycrystalline silicon substrate according to Embodiment 3.

Next, as shown in FIG. 28C, a region of the amorphous silicon thin film 401 irradiated with laser light LB is crystallized so as to form a polycrystalline silicon thin film 402 made of polycrystalline silicon (crystallization step).

To be specific, first, preparation is performed to irradiate the amorphous silicon thin film 401 with predetermined light by preparing a light beam having a predetermined wavelength in order to crystallize the amorphous silicon thin film 401.

Next, the amorphous silicon thin film 401 is crystallized by using a crystalline semiconductor thin film forming apparatus shown in FIG. 20. Specifically, the amorphous silicon thin film 401 is crystallized by irradiating the surface of the amorphous silicon thin film 401 with laser light LB having a predetermined light intensity distribution. To be more specific, laser light LB is scanned relative to the amorphous silicon thin film 401 at a predetermined speed in the scanning direction so as to irradiate the amorphous silicon thin film 401 with the laser light LB. The region of the amorphous silicon thin film 401 irradiated with the laser light LB is annealed by thermal energy of the laser light LB and then crystallized to form a polycrystalline silicon thin film 402.

Figure 28D:
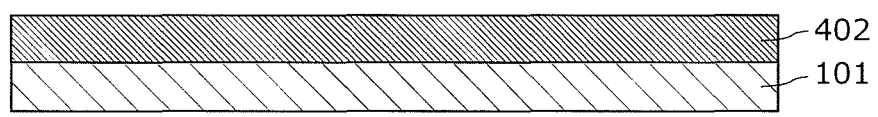
FIG. 28D is a cross-sectional view schematically showing a polycrystalline silicon substrate forming step of the method for manufacturing a polycrystalline silicon substrate according to Embodiment 3.

After that, the irradiation of the amorphous silicon thin film 401 with the laser light LB is continued until a predetermined position is reached, and thereby a polycrystalline silicon thin film 402 is formed as shown in FIG. 28D.

Next, the formed polycrystalline silicon thin film 402 is subjected to a hydrogen plasma treatment so as to hydrogenate the silicon atoms in the polycrystalline silicon thin film 402. The hydrogen plasma treatment is performed by, for example, generating a hydrogen plasma by application of radio frequency (RF) power by using a gas containing a hydrogen gas such as $H_2$, or $H_2$/argon (Ar) as a raw material, and irradiating the polycrystalline silicon thin film 402 with the hydrogen plasma. Through the hydrogen plasma treatment, dangling bonds (defects) of silicon atoms are hydrogen-terminated, reducing the crystal defect density of the polycrystalline silicon thin film 402, and improving the crystallinity of the polycrystalline silicon thin film 402.

In the present embodiment, subsequently, testing is performed to determine whether the polycrystalline silicon thin film 402 has a half-width of the Raman band corresponding to a phonon mode specific thereto that satisfies a range of 5.0 $cm^{-1}$ or more and 6.0 $cm^{-1}$ or less. As a result of testing, only a polycrystalline silicon thin film 402 that satisfies the above condition is selected (chosen). In this way, only a polycrystalline silicon thin film 402 made of a thin film whose crystallinity varies little can be selected. The polycrystalline silicon thin film 402 selected in the manner described above has an average crystal grain size of about 50 nm or more and 300 nm or less, and a maximum surface roughness (Rmax) of 50 nm or more and 60 nm or less (or an average surface roughness (Ra) of 3.2 nm or more and 4 nm or less).

Figure 29:
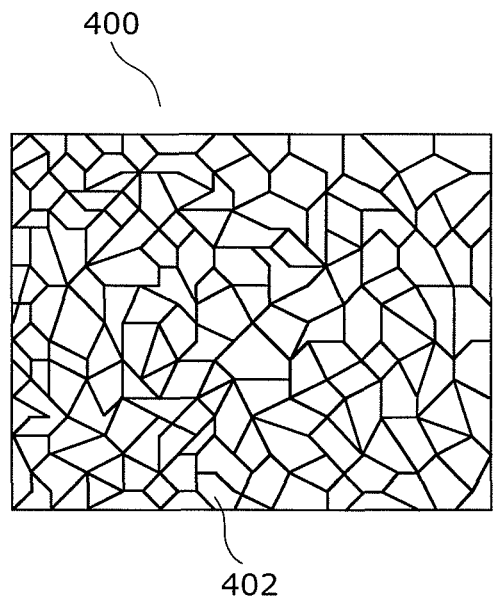
FIG. 29 is a top view schematically showing a state of the crystal structure of a polycrystalline silicon thin film according to Embodiment 3.

The crystal structure of the polycrystalline silicon thin film 402 will be described with reference to FIG. 29. FIG. 29 is a top view schematically showing a state of the crystal structure of a polycrystalline silicon thin film according to the present embodiment.

As shown in FIG. 29, the polycrystalline silicon thin film 402 is made of a plurality of crystal grains (crystal particles) having different crystal grain sizes, and the boundary of crystal grains forms a crystal grain boundary. That is, in the polycrystalline silicon thin film having a Raman half-width of 5.2 $cm^{-1}$ or more and 5.8 $cm^{-1}$ or less, polycrystalline silicon is formed, with the crystal grain size being 30 nm or more and 300 nm or less.

As described above, according to the present embodiment, it is possible to achieve a polycrystalline silicon substrate 400 including a polycrystalline silicon thin film whose crystallinity varies little and that has a maximum surface roughness (Rmax) of 50 nm or more and 60 nm or less (or an average surface roughness (Ra) of 3.2 nm or more and 4 nm or less).

The method for selecting only a polycrystalline silicon thin film 402 whose crystallinity varies little is not limited to the method using Raman half-width. That is, it is possible to select a polycrystalline silicon thin film having a ratio between the Raman half-width of the polycrystalline silicon thin film 402 and the Raman half-width of monocrystalline silicon that satisfies a range of 1.4 or more and 1.7 or less, or a polycrystalline silicon thin film having a difference between the Raman half-width of the polycrystalline silicon thin film 402 and the Raman half-width of a monocrystalline silicon substrate that satisfies a range of 1.5 $cm^{-1}$ or more and 2.3 $cm^{-1}$ or less. It is also possible to select a polycrystalline silicon thin film having a (peak value-to-Raman half-width) ratio of the peak value in the Raman band of the polycrystalline silicon thin film 402 with respect to the Raman half-width of the polycrystalline silicon thin film 402 that satisfies a range of 0.08 or more and 0.22 or less. The peak position in the Raman band of the polycrystalline silicon thin film 402 is observed at 516 $cm^{-1}$ or more and 518 $cm^{-1}$ or less, and monocrystalline silicon (c-Si) has a Raman half-width value of 3.4 $cm^{-1}$.

Embodiment 4

Embodiment 2, an example of a bottom-gate thin film transistor has been described as an example of an electronic device including a polycrystalline silicon thin film whose crystallinity varies little, but the present disclosure is not limited thereto. The electronic device including a polycrystalline silicon thin film whose crystallinity varies little may be a top-gate thin film transistor. This will be described below.

Figure 30:
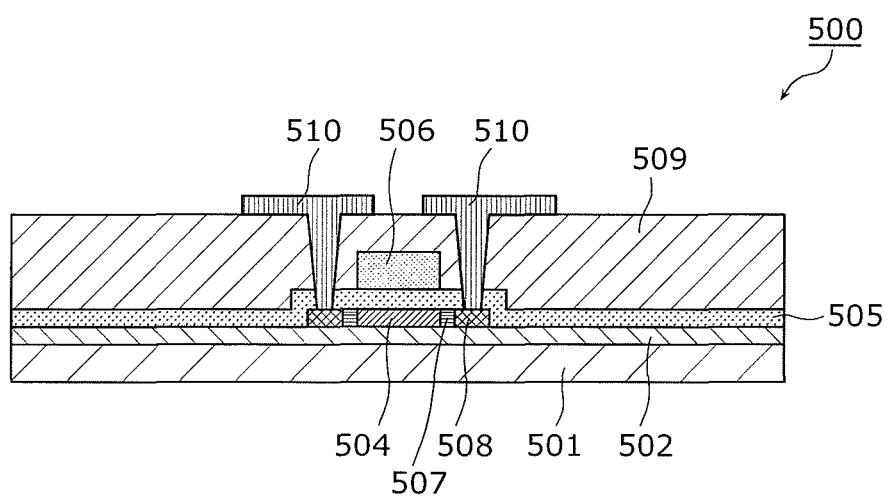
FIG. 30 is a cross-sectional view schematically showing a configuration of a thin-film transistor device according to Embodiment 4.

FIG. 30 is a cross-sectional view schematically showing a thin-film transistor device according to Embodiment 4.

A thin film transistor 500 shown in FIG. 30 includes a substrate 501 made of a glass substrate, an undercoat film 502 made of an insulating film such as a silicon oxide film or a silicon nitride film, a polycrystalline silicon thin film 504, a gate insulating film 505 made of an insulating film of silicon dioxide or the like, a gate electrode 506 made of molybdenum tungsten (MoW) or the like, an LDD region 507, a source/drain electrode 508, a passivation film 509 made of an insulating film of silicon dioxide or the like, and a source/drain electrode film 510.

The LDD region 507 is located at each end of the polycrystalline silicon thin film 504, and is formed by lightly doping each end of the polycrystalline silicon thin film 504 with an impurity.

The source/drain electrode 508 is located at each end of the LDD region 507, and is formed by further doping each end of the LDD region 507 with an impurity.

The polycrystalline silicon thin film 504 is, for example, an example of a polycrystalline silicon thin film, and can be formed by, for example, crystallizing non-crystalline amorphous silicon (amorphous silicon).

In the polycrystalline silicon thin film 504, the crystalline silicon has an average crystal grain size of about 50 nm or more and 300 nm or less. The polycrystalline silicon thin film 504 has a thickness of, for example, about 20 nm or more and 100 nm or less. Also, the crystallinity of the polycrystalline silicon thin film 504 can be expressed as follows. To be specific, the half-width (hereinafter also referred to as "Raman half-width") of the Raman band corresponding to a phonon mode specific to the polycrystalline silicon thin film 504 is 5.0 cm$^{-1}$ or more and less than 6.0 cm$^{-1}$. As used herein, the phonon mode specific to the polycrystalline silicon thin film 504 refers to a transverse optical (TO) phonon mode.

The crystallinity of the polycrystalline silicon thin film 504 may be expressed in a different manner. For example, it is possible to use the ratio between the Raman half-width of the polycrystalline silicon thin film 504 and the Raman half-width of monocrystalline silicon that satisfies a range of 1.4 to 1.7. Alternatively, it is possible to use the difference between the Raman half-width of the polycrystalline silicon thin film 504 and the Raman half-width of a monocrystalline silicon substrate that satisfies a range of 1.5 cm$^{-1}$ or more and 2.3 cm$^{-1}$ or less. Furthermore, it is possible to use the (peak value-to-Raman half-width) ratio of the peak value in the Raman band of the polycrystalline silicon thin film 504 with respect to the Raman half-width of the polycrystalline silicon thin film 504 that satisfies a range of 0.08 or more and 0.22 or less. The peak position in the Raman band of the polycrystalline silicon thin film 504 is observed at 516 cm$^{-1}$ or more and 518 cm$^{-1}$ or less, and the value of the Raman half-width of monocrystalline silicon (c-Si) is 3.4 cm$^{-1}$.

Also, the crystals of the polycrystalline silicon thin film 504 are predominantly oriented in the (100) direction, and not in the (111) direction. The polycrystalline silicon thin film 504 has a maximum surface roughness (Rmax) of 50 nm or more and 60 nm or less, and the polycrystalline silicon thin film 504 has an average surface roughness (Ra) of 3.2 nm or more and 4 nm or less.

The thin film transistor 500 is configured as described above.

That is, the polycrystalline silicon thin film 504 has a half-width of the Raman band corresponding to a phonon mode specific thereto that satisfies a range of 5.0 cm$^{-1}$ or more and less than 6.0 cm$^{-1}$, and an average crystal grain size that satisfies a range of about 50 nm or more and 300 nm or less. Accordingly, in the thin film transistor 500, the polycrystalline silicon thin film 504 has a maximum surface roughness (Rmax) of 50 nm or more and 60 nm or less (or an average surface roughness (Ra) of 3.2 nm or more and 4 nm or less). Thus, the thin film transistor 500 can include a polycrystalline silicon thin film whose crystallinity varies little.

As in Embodiments 1 and 2, the thin film transistor 500 is formed by using a polycrystalline silicon thin film 504 selected during the manufacturing process thereof described later, the selected polycrystalline silicon thin film 504 being a polycrystalline silicon thin film that satisfies at least a Raman half-width corresponding to a phonon mode specific thereto of 5.0 cm$^{-1}$ or more and less than 6.0.

Next, a method for manufacturing a top-gate thin film transistor according to the present embodiment will be described with reference to FIGS. 31A to 31H. FIGS. 31A to 31H are cross-sectional views schematically showing the steps of the method for manufacturing a top-gate thin film transistor 500 according to the present embodiment.

Figure 31A:
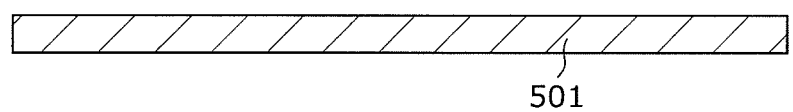
FIG. 31A is a cross-sectional view schematically showing a substrate preparation step of a method for manufacturing a top-gate thin film transistor according to Embodiment 4.

As shown in FIG. 31A, first, a substrate 501 is prepared (substrate preparation step). As the substrate 501, for example, a glass substrate can be used.

Figure 31B:
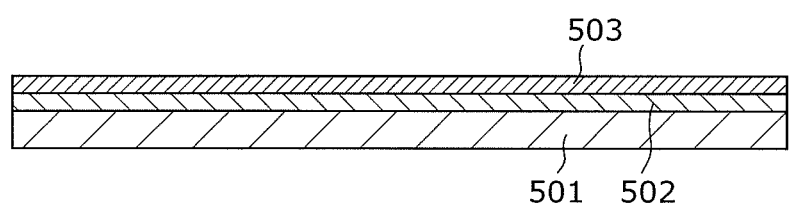
FIG. 31B is a cross-sectional view schematically showing a silicon thin film forming step of the method for manufacturing a top-gate thin film transistor according to Embodiment 4.

Next, as shown in FIG. 31B, an undercoat film 502 made of an insulating film such as a silicon oxide film or a silicon nitride film is formed on the substrate 501. After that, as shown in FIG. 31B, an amorphous silicon thin film 503 is formed above the substrate 501 (silicon thin film forming step). For example, an amorphous silicon film is formed on the undercoat film 502 by plasma CVD or the like as an amorphous silicon thin film 503.

Figure 31C:
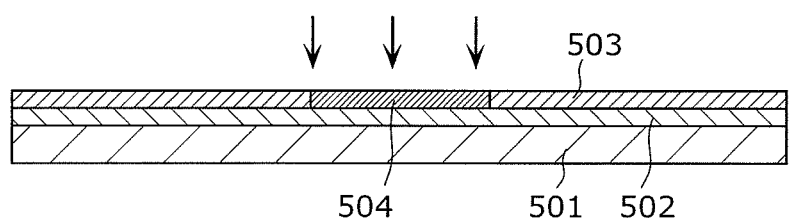
FIG. 31C is a cross-sectional view schematically showing a silicon thin film crystallization step of the method for manufacturing a top-gate thin film transistor according to Embodiment 4.

Next, as shown in FIG. 31C, a predetermined region of the amorphous silicon thin film 503 is irradiated with laser light LB while laser light is scanned relative to the amorphous silicon thin film 503, so as to crystallize the amorphous silicon thin film 503 and form a polycrystalline silicon thin film 504 (silicon thin film crystallization step). This step is performed by the same method as the crystallization step of the thin film formed substrate manufacturing method, specifically, the silicon thin film crystallization step of the method for manufacturing a bottom-gate thin-film transistor device 100 shown in FIG. 2D, or the crystallization step of the method for manufacturing a polycrystalline silicon substrate 400 shown in FIG. 28C.

To be specific, first, preparation is performed to irradiate the amorphous silicon thin film 503 with predetermined light by preparing a light beam having a predetermined wavelength in order to crystallize the amorphous silicon thin film 503. As used herein, the predetermined light is, for example, green laser light.

Next, the amorphous silicon thin film 503 is crystallized by using a crystalline semiconductor thin film forming apparatus shown in FIG. 20. Specifically, the amorphous silicon thin film 503 is crystallized by irradiating the surface of the amorphous silicon thin film 503 with laser light LB having a predetermined light intensity distribution.

Next, testing is performed to determine whether the polycrystalline silicon thin film 504 has a half-width of the Raman band corresponding to a phonon mode specific thereto that satisfies a range of 5.0 cm$^{-1}$ or more and less than 6.0 cm$^{-1}$. As a result of testing, only a polycrystalline silicon thin film 504 that satisfies the above condition is selected. In this way, only a polycrystalline silicon thin film 504 made of a thin film whose crystallinity varies little can be selected. The polycrystalline silicon thin film 504 selected in the manner described above has an average crystal grain size of about 50 nm or more and 300 nm or less, and a maximum surface roughness (Rmax) of 50 nm or more and 60 nm or less (or an average surface roughness (Ra) of 3.2 nm or more and 4 nm or less).

Figure 31D:
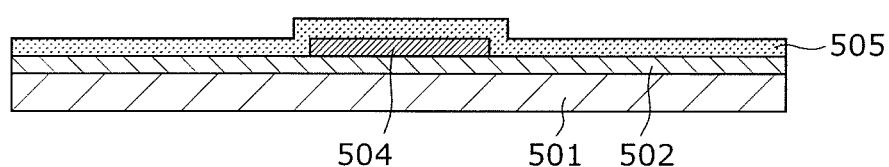
FIG. 31D is a cross-sectional view schematically showing a gate insulating film forming step of the method for manufacturing a top-gate thin film transistor according to Embodiment 4.

Next, as shown in FIG. 31D, photolithography and wet etching are performed on the substrate 501 including the selected polycrystalline silicon thin film 504, whereby the amorphous silicon thin film 503 that is a region that is not irradiated with laser and thus is uncrystallized and the polycrystalline silicon thin film 504 that has been crystallized by irradiation with laser are selectively patterned. To be specific, the amorphous silicon thin film 503 is removed, and at the same time the polycrystalline silicon thin film 504 is patterned to form islands of polycrystalline silicon thin film 504.

After that, as shown in the same diagram, namely, FIG. 31D, a gate insulating film 505 is formed above the substrate 501 (gate insulating film forming step). For example, a gate insulating film 505 made of an insulating film of silicon dioxide or the like is formed on the entire surface of the substrate 501 by plasma CVD or the like so as to cover the islands of polycrystalline silicon thin film 504.

Figure 31E:
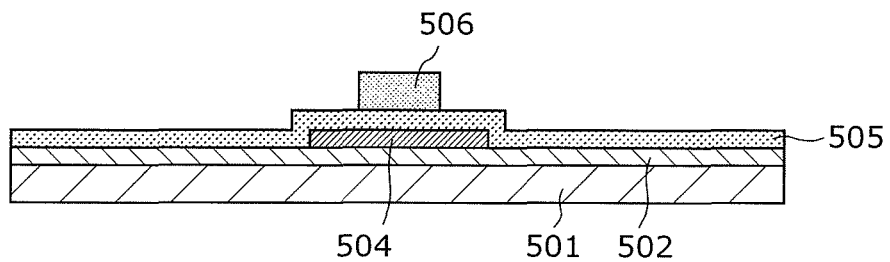
FIG. 31E is a cross-sectional view schematically showing a gate electrode forming step of the method for manufacturing a top-gate thin film transistor according to Embodiment 4.

Next, as shown in FIG. 31E, a gate electrode 506 is pattern-formed above the substrate 501 (gate electrode forming step). For example, a gate metal film made of molybdenum tungsten (MoW) or the like is formed on the entire surface of the substrate 501 by sputtering. Then, patterning is performed on the gate metal film through photolithography and wet etching, and thereby a gate electrode 506 having a predetermined shape is formed above the polycrystalline silicon thin film 504 via the gate insulating film 505.

Figure 31F:
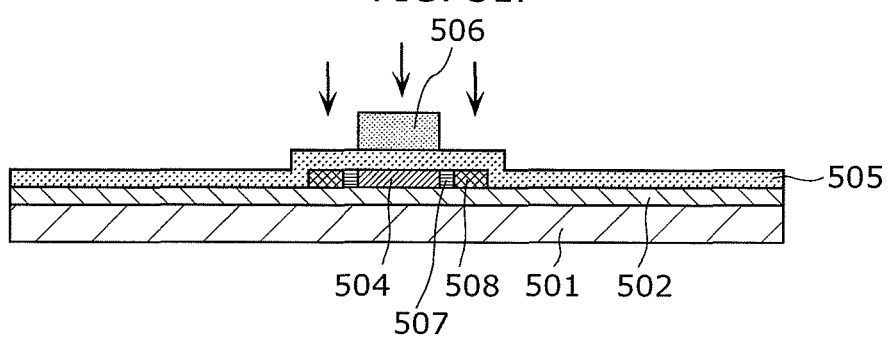
FIG. 31F is a cross-sectional view schematically showing a source/drain electrode forming step of the method for manufacturing a top-gate thin film transistor according to Embodiment 4.

Next, as shown in FIG. 31F, each end of the polycrystalline silicon thin film 504 is lightly doped with an impurity by using the gate electrode 506 as a mask, and a lightly doped drain (LDD) region 507 is thereby formed. Also, each end of the LDD region 507 is further doped with an impurity, and a source/drain electrode 508 is formed at each end of the LDD region 507.

Figure 31G:
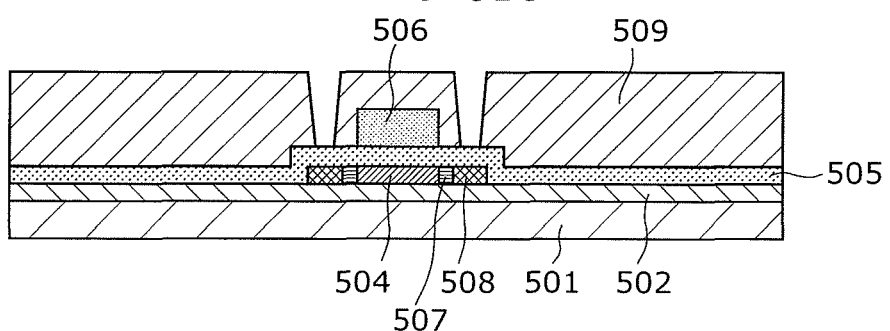
FIG. 31G is a cross-sectional view schematically showing a passivation film forming step of the method for manufacturing a top-gate thin film transistor according to Embodiment 4.

Next, as shown in FIG. 31G, a passivation film 509 is formed above the substrate 501. For example, a passivation film 509 made of an insulating film of silicon dioxide or the like is formed on the entire surface of the substrate 501 by plasma CVD or the like so as to cover the gate electrode 506 and the gate insulating film 505. After that, as shown in FIG. 31G, contact holes are formed in the passivation film 509 so as to expose the source/drain electrode 508.

Figure 31H:
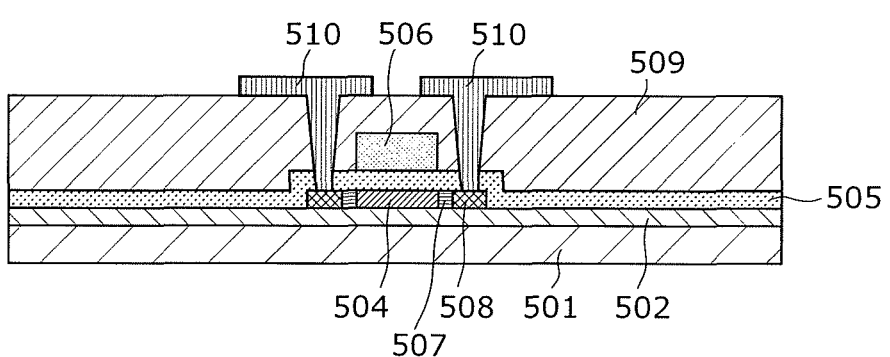
FIG. 31H is a cross-sectional view schematically showing a source/drain electrode film forming step of the method for manufacturing a top-gate thin film transistor according to Embodiment 4.

Next, as shown in FIG. 31H, a pair of source/drain electrode films 510 is formed on the passivation film 509 so as to fill the contact holes of the passivation film 509. Through this, as shown in FIG. 31H, a top-gate thin film transistor 500 can be manufactured.

As described above, according to the present embodiment, it is possible to achieve a thin film transistor 500 including a polycrystalline silicon thin film 504 whose crystallinity varies little and that has a maximum surface roughness (Rmax) of 50 nm or more and 60 nm or less (or an average surface roughness (Ra) of 3.2 nm or more and 4 nm or less).

The method for selecting only a polycrystalline silicon thin film 504 whose crystallinity varies little is not limited to the method using Raman half-width. That is, it is possible to select a polycrystalline silicon thin film having a ratio between the Raman half-width of the polycrystalline silicon thin film 504 and the Raman half-width of monocrystalline silicon that satisfies a range of 1.4 or more and 1.7 or less, or a polycrystalline silicon thin film having a difference between the Raman half-width of the polycrystalline silicon thin film 504 and the Raman half-width of a monocrystalline silicon substrate that satisfies a range of 1.5 $cm^{-1}$ to 2.3 $cm^{-1}$. It is also possible to select a polycrystalline silicon thin film having a (peak value-to-Raman half-width) ratio of the peak value in the Raman band of the polycrystalline silicon thin film with respect to the Raman half-width of the polycrystalline silicon thin film 504 that satisfies a range of 0.08 or more and 0.22 or less. The peak position in the Raman band of the polycrystalline silicon thin film 504 is observed at 516 $cm^{-1}$ or more and 518 $cm^{-1}$ or less, and monocrystalline silicon (c-Si) has a Raman half-width value of 3.4 $cm^{-1}$.

Embodiment 5

In Embodiment 5, as still another example of the electronic device, a solar cell including a polycrystalline silicon thin film whose crystallinity varies little will be described.

Figure 32:
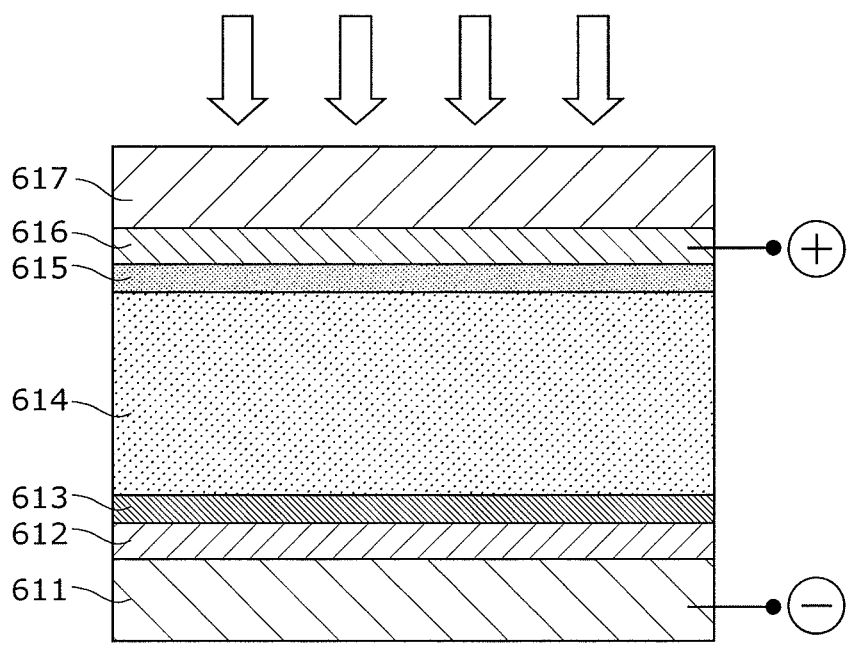
FIG. 32 is a cross-sectional view schematically showing a configuration of a solar cell according to Embodiment 5.

FIG. 32 is a cross-sectional view schematically showing a configuration of a solar cell according to Embodiment 5.

As shown in FIG. 32, a solar cell 600 includes a metal electrode 611, a transparent electrode 612, an n-crystalline Si layer 613, an i-crystalline Si layer 614 and a p-crystalline Si layer 615 that serve as photoelectric conversion units, a transparent electrode 616, and a glass substrate 617.

The metal electrode 611 is made of Ag, and the transparent electrodes 612 and 616 are made of ITO. Also, the n-crystalline Si layer 613, the i-crystalline Si layer 614 and the p-crystalline Si layer 615 serving as photoelectric conversion units are formed so as to have thicknesses of, for example, 20 to 100 nm, 2 to 3 μm, and 20 to 100 nm, respectively.

When sunlight enters the glass substrate 617 from above as indicated by arrows shown in FIG. 32, in the p-crystalline Si layer 615, the i-crystalline Si layer 614 and the n-crystalline Si layer 613 serving as photoelectric conversion units, the received light is instantaneously converted to power by photovoltaic effect, and the power is output as a voltage between the metal electrode 611 and the transparent electrode 616.

The glass substrate 617 is, for example, an example of a substrate. The p-crystalline Si layer 615 is a crystal seed layer, and is an example of a polycrystalline silicon thin film. The i-crystalline Si layer 614 is a layer epitaxially grown from the p-crystalline Si layer 615.

That is, the p-crystalline Si layer 615 is, for example, an example of a polycrystalline silicon thin film, and can be formed by, for example, crystallization of non-crystalline amorphous silicon (amorphous silicon).

In the p-crystalline Si layer 615, the crystalline silicon has an average crystal grain size of about 50 nm or more and 300 nm or less. The p-crystalline Si layer 615 has a thickness of, for example, about 20 nm or more and 100 nm or less. The crystallinity of the p-crystalline Si layer 615 can be expressed as follows. To be specific, the half-width (hereinafter also referred to as "Raman half-width") of the Raman band corresponding to a phonon mode specific to the p-crystalline Si layer 615 is 5.0 $cm^{-1}$ or more and less than 6.0 $cm^{-1}$. As used herein, the phonon mode specific to the p-crystalline Si layer 615 refers to a transverse optical (TO) phonon mode.

The crystallinity of the p-crystalline Si layer 615 may be expressed in a different manner. For example, it is possible to use the ratio between the Raman half-width of the p-crystalline Si layer 615 and the Raman half-width of monocrystalline silicon that satisfies a range of 1.4 or more and 1.7. Alternatively, it is possible to use the difference between the Raman half-width of the p-crystalline Si layer 615 and the Raman half-width of a monocrystalline silicon substrate that satisfies a range of 1.5 $cm^{-1}$ or more and 2.3 $cm^{-1}$ or less. Furthermore, it is possible to use the (peak value-to-Raman half-width) ratio of the peak value in the Raman band of the p-crystalline Si layer 615 with respect to the Raman half-width of the p-crystalline Si layer 615 that satisfies a range of 0.08 or more and 0.22 or less. The peak position in the Raman band of the p-crystalline Si layer 615 is observed at 516 $cm^{-1}$ or more and 518 $cm^{-1}$ or less, and the Raman half-width value of monocrystalline silicon (c-Si) is 3.4 $cm^{-1}$.

Also, the crystals of the p-crystalline Si layer 615 are predominantly oriented in the (100) direction, and not in the (111) direction. The p-crystalline Si layer 615 has a maximum surface roughness (Rmax) of 50 nm or more and 60 nm or less, and the p-crystalline Si layer 615 has an average surface roughness (Ra) of 3.2 nm or more and 4 nm or less.

The solar cell 600 having the p-crystalline Si layer 615 is configured as described above.

That is, the p-crystalline Si layer 615 has a half-width of the Raman band corresponding to a phonon mode specific thereto that satisfies a range of 5.0 $cm^{-1}$ or more and less than 6.0 $cm^{-1}$. Also, the average crystal grain size satisfies a range of about 50 nm or more and 300 nm or less. Accordingly, in the solar cell 600, the p-crystalline Si layer 615 has an average crystal grain size that satisfies a range of about 50 nm or more and 300 nm or less, and a maximum surface roughness (Rmax) that satisfies a range of 50 nm or more and 60 nm or less (or an average surface roughness (Ra) of 3.2 nm or more and 4 nm or less). As described above, the solar cell 600 can include a polycrystalline silicon thin film whose crystallinity varies little.

In the manner as described above, by satisfying a preferred film quality condition, it is possible to achieve a crystalline silicon substrate including a polycrystalline silicon thin film whose crystallinity varies little, a method for manufacturing such a crystalline silicon substrate, and an electronic device.

Because of little variability in the crystallinity and a reduction in the surface roughness, the crystalline silicon substrate according to the present disclosure provides an advantageous effect of easy manufacturing of electronic devices. That is, the crystalline silicon substrate according to the present disclosure is applicable not only to a thin film transistor and a thin-film solar cell described above, but also to a contact image sensor, a light-emitting device, a ballistic electron emitter, and the like.

The thin-film transistor device as a specific aspect of the electronic device of the present disclosure is applicable not only to an organic EL display apparatus including organic EL elements, but also to other display apparatuses including an active matrix substrate such as a liquid crystal display apparatus. Also, a display apparatus thus configured can be used as a flat panel display, and is applicable to various electronic appliances including a display panel such as television sets, personal computers, and mobile phones.

The crystalline silicon substrate, the method for manufacturing a crystalline silicon substrate, and the electronic device according to one or more aspects of the present disclosure have been described above by way of embodiments and a variation, but the thin-film transistor device and the method for manufacturing a thin-film transistor device according to the present disclosure are not limited to the embodiments and variation described above.

The present disclosure also encompasses other embodiments obtained by making various types of modifications that can be conceived by those skilled in the art to the above embodiments and variation, embodiments implemented by arbitrarily combining the structural elements and functions of the above embodiments and variation without departing from the spirit and scope of the present disclosure, and embodiments that are obtained by combining the structural elements of the above embodiments and variation.

INDUSTRIAL APPLICABILITY

The thin-film transistor device according to one or more exemplary embodiments disclosed herein has a wide variety of applications including display apparatuses used in television sets, personal computers, mobile phones and the like, and various other electric devices.

The herein disclosed subject matter is to be considered descriptive and illustrative only, and the appended Claims are of a scope intended to cover and encompass not only the particular embodiments disclosed, but also equivalent structures, methods, and/or uses.

The invention claimed is:

1. A thin-film transistor device comprising:
a gate electrode formed above a substrate;
a gate insulating film formed on the gate electrode;
a crystalline silicon thin film that is formed above the gate insulating film and has a channel region,
a semiconductor film formed on the crystalline silicon thin film; and
a source electrode and a drain electrode that are formed above the channel region,
wherein the crystalline silicon thin film has a half-width of a Raman band corresponding to a phonon mode specific to the crystalline silicon thin film of 5.0 $cm^{-1}$ or more and less than 6.0 $cm^{-1}$,
the crystalline silicon thin film has an average crystal grain size of about 50 nm or more and 300 nm or less, and
the crystalline silicon thin film contains crystals that are predominantly oriented in (100) direction among (111) and (100) directions and have an orientation intensity in the (100) direction obtained by electron back-scatter diffraction of 5 or less.

2. The thin-film transistor device according to claim 1, wherein a ratio of the half-width of the Raman band of the crystalline silicon thin film with respect to a half-width of a Raman band of monocrystalline silicon is 1.5 or more and 1.8 or less.

3. The thin-film transistor device according to claim 1, wherein a difference between the half-width of the Raman band of the crystalline silicon thin film and a half-width of a Raman band of monocrystalline silicon is 1.8 $cm^{-1}$ or more and 2.4 $cm^{-1}$ or less.

4. The thin-film transistor device according to claim 1, wherein a ratio of a peak value of the Raman band of the crystalline silicon thin film with respect to a half-width of a Raman band of crystalline silicon is 0.1 or more and 0.2 or less.

5. The thin-film transistor device according to claim 1, wherein a peak position in the Raman band of the crystalline silicon thin film is 516 $cm^{-1}$ or more and 518 $cm^{-1}$ or less.

6. The thin-film transistor device according to claim 1, wherein the crystalline silicon thin film has a field-effect mobility of 20 $cm^2/V \cdot s$ or more and 50 $cm^2/V \cdot s$ or less.

7. The thin-film transistor device according to claim 1, further comprising:
a channel protection layer formed on the semiconductor film formed above the channel region.

8. The thin-film transistor device according to claim 1, further comprising:
a channel protection layer for protecting the channel region, the channel protection layer being formed between the semiconductor film and the crystalline silicon thin film.

* * * * *